United States Patent
Hayakawa

(10) Patent No.: US 6,654,212 B2
(45) Date of Patent: Nov. 25, 2003

(54) MAGNETIC SENSOR CAPABLE OF PROVIDING STABLE RESISTANCE CHANGE RATE

(75) Inventor: Yasuo Hayakawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 49 days.

(21) Appl. No.: 10/097,838

(22) Filed: Mar. 14, 2002

(65) Prior Publication Data
US 2003/0021072 A1 Jan. 30, 2003

(30) Foreign Application Priority Data
Mar. 15, 2001 (JP) ........................................ 2001/074128

(51) Int. Cl.[7] ................................................ G11B 5/39
(52) U.S. Cl. .................................................. 360/324.2
(58) Field of Search ........................ 360/324.1, 324.11, 360/324.12, 324.2

(56) References Cited

U.S. PATENT DOCUMENTS

| | | | | |
|---|---|---|---|---|
| 5,390,061 | A | 2/1995 | Nakatani et al. | 360/324.2 |
| 5,801,984 | A | 9/1998 | Parkin | 365/158 |
| 5,835,314 | A | 11/1998 | Moodera et al. | 360/324.2 |
| 5,986,858 | A | 11/1999 | Sato et al. | 360/324.2 |
| 6,459,551 | B1 * | 10/2002 | Hayakawa | 360/313 |
| 6,515,824 | B1 * | 2/2003 | Sato | 360/126 |
| 2001/0046109 | A1 * | 11/2001 | Nishiyama et al. | 360/320 |
| 2002/0006020 | A1 * | 1/2002 | Hasegawa | 360/324.2 |
| 2002/0141119 | A1 * | 10/2002 | Saito | 360/319 |
| 2003/0030948 | A1 * | 2/2003 | Umetsu | 360/324.12 |

* cited by examiner

Primary Examiner—Jefferson Evans
(74) Attorney, Agent, or Firm—Brinks Hofer Gilson & Lione

(57) ABSTRACT

An insulation barrier layer is formed using an insulating material expressed by a composition formula of Al—Si—O or Si—O—N. The insulation barrier layer is therefore able to have improved dielectric strength, developer resistance, smoothness, and heat radiation.

7 Claims, 15 Drawing Sheets

MAGNETIC SENSOR CAPABLE OF PROVIDING STABLE RESISTANCE CHANGE RATE

BACKGROUND OF THE INVENTION

1. Field of the Invention

The present invention relates to a magnetic sensor for detecting a magnetic field by utilizing the tunneling magnetoresistive effect. More particularly, the present invention relates to a magnetic sensor, which is capable of providing a stable resistance change rate and can be formed with good reproducibility, as well as to a method for manufacturing the magnetic sensor.

2. Description of the Related Art

A GMR (giant magnetoresistive) sensor exhibiting the giant magnetoresistive effect is employed as a head mounted on, e.g., a hard disk drive and dedicated to reproduction, and it is known as having a high sensitivity.

Among various types of GMR sensors, there is a spin valve film having a relatively simple structure and having resistance capable of being changed by a weak external magnetic field. The spin valve film is of a four-layered structure in the simplest form.

FIG. 19 schematically partly shows a structure of a spin valve film. FIG. 19 is a sectional view looking from the side facing a recording medium.

In FIG. 19, reference numerals 1 and 3 each denote a ferromagnetic layer made of a NiFe alloy, for example. A nonmagnetic electrically conductive layer 2 made of Cu, for example, is interposed between the two ferromagnetic layers.

In the spin valve film of FIG. 19, the ferromagnetic layer 1 is the so-called free magnetic layer, and the ferromagnetic layer 3 is the so-called pinned magnetic layer. In this specification, the ferromagnetic layer 1 and the ferromagnetic layer 3 will be referred to as "free magnetic layer" and "pinned magnetic layer" hereinafter, respectively.

Also, as shown in FIG. 19, an antiferromagnetic layer 4 made of a NiMn alloy, for example, is formed on the pinned magnetic layer 3 in contact with each other. With annealing a carried out under a magnetic field, an exchange anisotropic magnetic field is generated between the pinned magnetic layer 3 and the antiferromagnetic layer 4, whereby magnetization of the pinned magnetic layer 3 is pinned in the height direction (Y-direction as shown).

On the other hand, magnetization of the free magnetic layer 1 is affected by a bias layer (not shown), etc., and aligned in the track-width direction (X-direction as shown). The magnetized directions of the pinned magnetic layer 3 and the free magnetic layer 1 are thus in a crossing relation.

A pair of electrode layers 5, 5 are provided, as shown in FIG. 19, on both sides of a multilayered film, including from the free magnetic layer 1 to the antiferromagnetic layer 4, as viewed in the track-width direction (X-direction). The electrode layers 5, 5 are formed of, e.g., Cu (copper), W (tungsten) or Cr (chromium).

In the spin valve film shown in FIG. 19, when the magnetized direction of the free magnetic layer 1 is varied depending on a leakage magnetic field from a recording medium such as a hard disk, electrical resistance is changed based on correlation to the magnetized direction of the pinned magnetic layer 3, whereby a voltage change is resulted depending on a change in value of the electrical resistance. In accordance with such a voltage change, the leakage magnetic field from the recording medium is detected. A resistance change rate (MR ratio) of the spin valve film is in the range of about several to ten-odd percentages.

Meanwhile, with the recent progress toward higher recording density, the plane recording density of a hard disk drive has been increased more and more. Such a trend raises a problem as to whether GMR sensors primarily used at present are adaptable for higher recording density expected in the future.

In that situation, attention has been focused on a tunneling magnetoresistive sensor as a reproduction head to be employed in place of GMR sensors. The tunneling magnetoresistive sensor has a resistance change rate (TMR ratio) as high as several tens of percent, and hence is able to produce a much greater reproduction output than that obtainable with the GMR sensors.

FIG. 20 schematically partly shows a structure of a conventional tunneling magnetoresistive sensor. FIG. 20 is a sectional view looking from the side facing a recording medium.

In FIG. 20, as with the spin valve film shown in FIG. 19, numerals 1 and 3 denote a free magnetic layer and a pinned magnetic layer, respectively. An antiferromagnetic layer 4 is formed on the pinned magnetic layer 3 in contact with each other.

The structure of the tunneling magnetoresistive sensor differs from that of the spin valve film primarily in the following points. An insulation barrier layer 6 made of $Al_2O_3$ (alumina), for example, is formed between the free magnetic layer 1 and the pinned magnetic layer 3. Also, a pair of electrode layers 5, 5 are provided on both sides of a multilayered film, including from the free magnetic layer 1 to the antiferromagnetic layer 4, as viewed in the vertical direction (Z-direction as shown) relative to surfaces of the multilayered film.

In the tunneling magnetoresistive sensor, when a voltage is applied to the two ferromagnetic layers (i.e., the free magnetic layer 1 and the pinned magnetic layer 3), an electric current (tunnel current) flows through the insulation barrier layer 6 based on the tunnel effect.

In the tunneling magnetoresistive sensor, as with the spin valve film, magnetization of the pinned magnetic layer 3 is pinned in the Y-direction as shown, and magnetization of the free magnetic layer 1 is aligned in the X-direction as shown. Then, the magnetized direction of the free magnetic layer 1 is varied under an influence of an external magnetic field.

When the magnetized directions of the pinned magnetic layer 3 and the free magnetic layer 1 are antiparallel to each other, the tunnel current is hardest to flow and the resistance value is maximized. When the magnetized directions of the pinned magnetic layer 3 and the free magnetic layer 1 are parallel to each other, the tunnel current is easiest to flow and the resistance value is minimized.

Upon the magnetized direction of the free magnetic layer 1 being varied under the influence of the external magnetic field, a resulting change in electrical resistance is taken out as a voltage change, whereby a leakage magnetic field from the recording medium is detected.

A resistance change rate (TMR ratio; $\Delta R_{TMR}$) of the tunneling magnetoresistive sensor is expressed by $2P_P P_F/(1-P_P P_F)$. Herein, $P_P$ represents a spin polarization rate (i.e., difference in the number of electrons between upward spins and downward spins, which is normalized based on the total number of electrons; referred to simply as a "polarization rate" hereinafter) of the pinned magnetic layer. $P_F$ represents a polarization rate of the free magnetic layer. As seen from that formula, the resistance change rate is determined depending on the polarization rate of the ferromagnetic layer. Theoretically, the resistance change rate is increased as the polarization rate increases.

In most of conventional tunneling magnetoresistive sensors, the insulation barrier layer 6 is formed of $Al_2O_3$ (alumina).

With the recent progress toward higher recording density, however, the following problems have occurred in the conventional tunneling magnetoresistive sensors using $Al_2O_3$ as a material of the insulation barrier layer 6.

(1) The first problem resides in dielectric strength. The insulation barrier layer 6 is formed in a very small thickness as thin as 1 to 2 nm. When the insulation barrier layer 6 is formed in such a very small thickness, the film made of alumina cannot provide a satisfactory level of dielectric withstand voltage. Hence, when a large electric current flows through the tunneling magnetoresistive sensor, the insulation barrier layer 6 is apt to cause breakdown.

In particular, the tunneling magnetoresistive sensor has a large sensor resistance, and when a voltage is applied to the two ferromagnetic layers (i.e., the free magnetic layer 1 and the pinned magnetic layer 3), the insulation barrier layer 6 is subjected to a fairly large voltage. Therefore, a probability of breakdown of the insulation barrier layer 6 is increased.

Also, the insulation barrier layer 6 must be made thinner in order to reduce the sensor resistance. With the dielectric withstand voltage lowered correspondingly, however, an electrical short-circuit is more likely to occur between the free magnetic layer 1 and the pinned magnetic layer 3. This leads to a difficulty in reducing the thickness of the insulation barrier layer 6.

(2) The second problem resides in developer resistance. In a process after forming the tunneling magnetoresistive sensor shown in FIG. 20, a main electrode layer and an inductive head are formed on the electrode layer 5. When forming the main electrode layer and the inductive head, the process includes a step of forming a resist pattern. However, alumina is apt to dissolve in a strong alkaline developer, for example, which is used in the step of forming the resist pattern. Also, the etching rate of alumina is very high when exposed to the developer.

Because the insulation barrier layer 6 is a very thin film as mentioned above, low developer resistance raises a difficulty in forming the insulation barrier layer 6 with certainty.

Further, a magnetic sensor is mounted on a trailing end surface of a slider made of, e.g., alumina titanium carbide (Al—Ti—C). In a step of machining the slider after forming the magnetic sensor, the magnetic sensor is also exposed to liquids such as a cutting liquid and a lapping liquid. Because the insulation barrier layer 6 of the tunneling magnetoresistive sensor has a very small thickness, reliability of the product is greatly affected if, even though slightly, the insulation barrier layer 6 dissolves in those liquids or its properties change.

Conversely, to form the insulation barrier layer 6 having satisfactory levels of both dielectric withstand voltage and developer resistance, the film thickness of the insulation barrier layer 6 must be increased. This makes the tunnel current harder to flow.

(3) The third problem resides in heat radiation. A tunneling magnetoresistive sensor has high sensor resistance and generates a large amount of heat. Therefore, the insulation barrier layer 6 should have good heat radiation.

However, the insulation barrier layer 6 made of alumina cannot be said as having sufficient heat radiation. The sensor temperature is raised to such a level as adversely affecting characteristics.

Also, although alumina has relatively good smoothness, a material of the insulation barrier layer 6 is required to have better smoothness for forming the insulation barrier layer 6 as a very thin film.

Thus, the insulation barrier layer 6 made of alumina cannot satisfy required levels of all properties, i.e., dielectric strength, developer resistance, heat radiation, and smoothness.

SUMMARY OF THE INVENTION

With the view of overcoming the above-mentioned problems in the related art, it is an object of the present invention to provide a magnetic sensor and a method for manufacturing the magnetic sensor, in which an insulation barrier layer is formed of an Al—Si—O film or a Si—O—N film for improvements in dielectric strength, developer resistance, heat radiation, and smoothness of the insulation barrier layer.

A magnetic sensor of the present invention comprises a multilayered film and electrode layers formed on upper and lower sides of the multilayered film, the multilayered film being made up of an antiferromagnetic layer, a pinned magnetic layer of which magnetized direction is pinned by an exchange coupling magnetic field developed between the pinned magnetic layer and the antiferromagnetic layer, and a free magnetic layer formed on the pinned magnetic layer with an insulation barrier layer interposed therebetween, wherein the insulation barrier layer is formed using an insulating material expressed by a composition formula of Al—Si—O or Si—O—N.

With the present invention, by using an insulating material expressed by the composition formula of Al—Si—O or Si—O—N to form the insulation barrier layer, dielectric strength, developer resistance, smoothness, and heat radiation of the insulation barrier layer can be improved.

Accordingly, in spite of the insulation barrier layer being formed as a very thin film in thickness of 0.3 to 2.0 nm, it is possible to obtain the insulation barrier layer that is stable and is less susceptible to damages by an electric current and chemicals.

Also, when the insulation barrier layer is formed using alumina as conventional, it has been in fact impossible to reduce the thickness of the insulation barrier layer down to a value smaller than 1 nm. In contrast, with the present invention, the insulation barrier layer can be formed in thickness smaller than about 0.5 nm. As a result, the DC resistance value of the magnetic sensor can also be reduced. More specifically, according to the present invention, the DC resistance value of the magnetic sensor can be increased to the order of several tens of ohms (Ω) which is comparable to those of conventional GMR sensors.

Hence, heat generation of the magnetic sensor can be suppressed and noise resistance of the magnetic sensor can be improved.

Addition of Si leads to another advantage that the insulation barrier layer, which is formed of an insulating material expressed by the composition formula of Al—Si—O, has an improved dielectric withstand voltage in comparison with the insulation-barrier layer formed of alumina. As a result, a magnetic sensor can be provided in which breakdown is less likely to occur in the insulation barrier layer and a stable operation is ensured.

Further, the developer resistance of the insulation barrier layer is improved in comparison with the case of using alumina. While the etching rate of alumina is about 50 Å/min, addition of Si reduces the etching rate of the Al—Si—O film from such a value. When the amount of Si added is about 9 at %, the etching rate is almost 0 Å/min.

The magnetic sensor of the present invention can be used for forming a magnetic head of a hard disk drive. When forming a magnetic head of a hard disk drive, in a process after forming the magnetic sensor, a main electrode layer and an inductive head are formed on the electrode layer of the magnetic sensor. When forming the main electrode layer and the inductive head, the process includes a step of forming a resist pattern, and the magnetic sensor is exposed to a strong alkaline developer. With the present invention, however, since the insulation barrier layer is formed using an insulating material expressed by the composition formula of Al—Si—O or Si—O—N, the insulation barrier layer is hardly dissolved and the etching rate of the insulation barrier layer is small when exposed to the developer.

Further, the magnetic head is mounted on a trailing end surface of a slider made of, e.g., alumina titanium carbide (Al—Ti—C). In a step of machining the slider after forming the magnetic head, the magnetic sensor is also exposed to liquids such as a cutting liquid and a lapping liquid. With the present invention, the insulation barrier layer is hard to dissolve in the liquids used for machining the slider, and the etching rate of the insulation barrier layer is small when exposed to those liquids.

Accordingly, in spite of the insulation barrier layer being formed as a very thin film, the insulation barrier layer can be reliably formed.

The reason why the dielectric strength and the developer resistance of an Al—Si—O film are improved as compared with those of an alumina film is presumably in that addition of Si in an insulating material made of Al and O improves both the dielectric strength and the developer resistance on the basis of coupling between Si and O.

It is also confirmed that the insulation barrier layer has smoothness substantially at the same level as that of an alumina film.

Additionally, the insulation barrier layer has better heat radiation than an alumina film and is able to suppress a rise of the sensor temperature satisfactorily even when the current density increases as a result of higher recording density expected in the future.

Hence, an increase in resistance value of the magnetic sensor can be suppressed.

The reason why the insulation barrier layer has better heat radiation than an alumina film is presumably in that the atomic array of an Al—Si—O film has regularity at a short range. An alumina film structure is in a completely amorphous state. On the other hand, in the Al—Si—O film, as the amount of Si added increases, regularity at a short range gradually occurs in the atomic array and crystallinity is improved.

Whether regularity at a short range occurs in the atomic array can be determined by observing a transmitted electron-beam diffraction image of a film.

From experimental results described later, it is found that the amount of Si added is preferably in a range of not less than 2 at % but not more than 9 at % with respect to a total.

Also, in the present invention, when Si in an insulating material expressed by the composition formula of Al—Si—O is calculated in terms of $SiO_2$ based on stoichiometry in relation to O, a calculated amount of $SiO_2$ is preferably in a range of not less than 10 at % but not more than 38 at % in the insulating material.

Further, in the present invention, when Si in an insulating material expressed by the composition formula of Al—Si—O is calculated in terms of $SiO_2$ based on stoichiometry in relation to O, a calculated amount of $SiO_2$ is preferably in a range of not less than 6.1 mass % but not more than 26.0 mass % in the insulating material.

The insulation material (barrier) layer has a thickness preferably in a range of not less than 0.3 nm but not more than 2.0 nm. More preferably, the insulation barrier layer has a thickness in a range of not less than 0.3 nm but not more than 1.0 nm.

Thus, according to the present invention, since the insulation barrier layer is formed of an insulating material expressed by the composition formula of Al—Si—O or Si—O—N, the insulation barrier layer is able to have improved dielectric strength, developer resistance, smoothness, and heat radiation. As a result, a magnetic sensor utilizing the tunneling magnetoresistive effect can be provided in which, in spite of the thickness of the insulation barrier layer being reduced, it is possible to obtain a stable resistance change rate and to form the insulation barrier layer with good reproducibility.

Further, the present invention provides a method for manufacturing a magnetic sensor comprising a multilayered film and electrode layers formed on upper and lower sides of the multilayered film, the multilayered film being made up of an antiferromagnetic layer, a pinned magnetic layer of which magnetized direction is pinned by an exchange coupling magnetic field developed between the pinned magnetic layer and the antiferromagnetic layer, and a free magnetic layer formed on the pinned magnetic layer with an insulation barrier layer interposed therebetween, wherein after forming an AlSi thin film or a SiN thin film, the AlSi thin film or the SiN thin film is oxidized naturally or oxidized in a radical oxygen gas, thereby forming the insulation barrier layer of an insulating material expressed by the composition formula of Al—Si—O or Si—O—N.

With the method of the present invention, since the AlSi thin film or the SiN thin film is oxidized naturally or oxidized in a radical oxygen gas, the AlSi thin film or the SiN thin film can be uniformly oxidized at an appropriate oxidizing rate.

The insulation barrier layer of an insulating material expressed by the composition formula of Al—Si—O or Si—O—N may be formed by using a target made of AlSi or SiN and depositing a film by sputtering while introducing an $O_2$ gas to a sputtering apparatus.

With the above feature, since the target is made of AlSi or SiN, the Si amount can be set only based on a mixing ratio with respect to Al or N. Also, the Al—Si—O or Si—O—N film having a predetermined composition can be easily formed by reactive sputtering while an $O_2$ gas is introduced to a sputtering apparatus.

When forming the insulation barrier layer of an insulating material expressed by the composition formula of Al—Si—O, the Si content in the insulating material is preferably in a range of not less than 2 at % but not more than 9 at % with respect to a total. Further, the insulation barrier layer is preferably formed in thickness in a range of not less than 0.3 nm but not more than 2.0 nm. More preferably, the insulation barrier layer is formed in thickness in a range of not less than 0.3 nm but not more than 1.0 nm.

DESCRIPTION OF THE PREFERRED EMBODIMENTS

Figure 1:
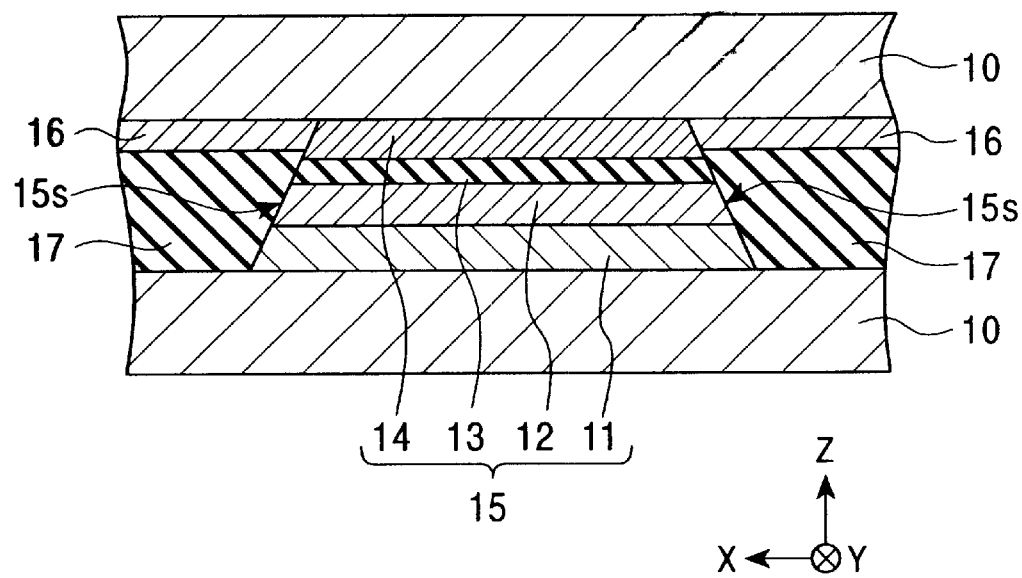
FIG. 1 is a partial sectional view of a magnetic sensor according to a first embodiment of the present. invention, looking from the side facing a recording medium.

FIG. 1 is a partial sectional view of a magnetic sensor according to a first embodiment of the present invention, looking from the side facing a recording medium.

Numeral 10 denotes an electrode layer. The electrode layer 10 is formed of, e.g., Cu (copper), W (tungsten) and Cr (chromium).

On the electrode layer 10, a multilayered film 15 is formed by successively forming an antiferromagnetic layer 11, a pinned magnetic layer 12, an insulation barrier layer 13, and a free magnetic layer 14 in that order. Opposite lateral end surfaces 15s, 15s of the multilayered film 15 are formed as slopes having a width therebetween, which gradually increases toward the lower side in FIG. 1.

The antiferromagnetic layer 11 is formed on the electrode layer 10. The antiferromagnetic layer 11 is preferably formed of an X—Mn alloy (where X represents one or more elements selected from among Pt, Pd, Ir, Rh, Ru and Os). Particularly, it is preferable to select Pt among the elements expressed by X and to employ a PtMn alloy as the antiferromagnetic layer 11.

Alternatively, the antiferromagnetic layer 11 may be formed of an X—Mn—X' alloy (where X' represents one or more elements selected from among Ne, Ar, Kr, Xe, Be, B, C, N, Mg, Al, Si, Pt, V, Cr, Fe, Co, Ni, Cu, Zn, Ga, Ge, Zr, Nb, Mo, Ag, Cd, Sn, Hf, Xa, W, Re, Au, Pb, and rare-earth elements).

Those alloys have an irregular-type face centered cubic (fcc) structure in a state immediately after formation of an alloy film, but are transformed-into a CuAuI regular-type face centered tetragonal (fct) structure through heat treatment.

The antiferromagnetic layer 11 has a film thickness in the range of 80–300 Å, e.g., 200 Å, near its center as viewed in the track-width direction.

In the PtMn alloy and the alloy expressed by the formula X—Mn, which are used to form the antiferromagnetic layer 11, Pt or X is preferably in the range of 37–63 at %. Also, in the PtMn alloy and the alloy expressed by the formula X—Mn, Pt or X is more preferably in the range of 47–57 at %. Note that unless particularly otherwise specified, upper and lower limits of the numerical range denoted by using a mark "–" represent respective values that are about equal to the indicated numerals.

In the alloy expressed by the formula Pt-Mn—X', X'+Pt is preferably in the range of 37–63 at %. Also, in the alloy expressed by the formula Pt—Mn—X', X'+Pt is more preferably in the range of 47–57 at %. Further, in the alloy expressed by the formula Pt—Mn—X', X' is preferably in the range of 0.2–10 at %. Additionally, when X' is one or more elements selected from among Pd, Ir, Rh, Ru, Os, Ni and Fe, X' is preferably in the range of 0.2–40 at %.

The antiferromagnetic layer 11 capable of generating a strong exchange coupling magnetic field between the antiferromagnetic layer 11 and the pinned magnetic layer 12 is obtained by using any of the above-mentioned alloys and heat-treating the alloy. In particular, using the PtMn alloy enables the antiferromagnetic layer 11 to have superior characteristics in that the exchange coupling magnetic field is not less than 48 kA/m, e.g., in excess of 64 kA/m, and the blocking temperature, at which the exchange coupling magnetic field disappears, is as high as 380° C.

The pinned magnetic layer 12 is formed on the antiferromagnetic layer 11.

The pinned magnetic layer 12 is formed of a film of, e.g., a NiFe alloy, Co, a CoNiFe alloy, or a CoFe alloy.

With heat treatment, an exchange coupling magnetic field is generated between the pinned magnetic layer 12 and the antiferromagnetic layer 11. The pinned magnetic layer 12 is magnetized by the generated exchange coupling magnetic field in the Y-direction as shown.

The insulation barrier layer 13 is formed on the pinned magnetic layer 12.

Further, the free magnetic layer 14 is formed on the insulation barrier layer 13. The free magnetic layer 14 is formed of a film of, e.g., a NiFe alloy, Co, a CoNiFe alloy, or a CoFe alloy.

On both sides of the multilayered film 15 in the track-width direction (X-direction as shown), insulating layers 17 are formed for electrical insulation between two electrode layers 10 and 10 on the upper and lower sides, which are formed respectively on and under the multilayered film 15 to cover bias layers 16 and the insulating layers 17 as well.

The bias layers 16 are formed for aligning the magnetization of the free magnetic layer 14 in the track-width direction (X-direction). In the magnetic sensor (tunneling magnetoresistive sensor) shown in FIG. 1, the bias layers 16 are each formed of a hard magnetic material, for example, a Co—Pt alloy film or a Co—Cr—Pt alloy film in practice.

Then, the upper electrode layer 10 made of a similar material as that used for the lower electrode layer 10 is formed on the multilayered film 15 and the bias layers 16.

The magnetic sensor shown in FIG. 1 is the so-called tunneling magnetoresistive sensor.

The tunneling magnetoresistive sensor is a magnetic sensor for reproduction, which detects a leakage magnetic field from a recording medium by utilizing the tunnel effect. When a sensing current is supplied from the electrode layers 10, 10 to flow through the multilayered film 15 in the Z-direction as shown, the magnitude of the tunnel current passing the multilayered film 15 is changed depending on the relationship in magnetization between the free magnetic layer 14 and the pinned magnetic layer 12.

Upon an external magnetic field entering the tunneling magnetoresistive sensor in the Y-direction, the magnetized direction of the free magnetic layer 14 is varied under an influence of the external magnetic field. Correspondingly, the magnitude of the tunnel current is also changed and a resulting change in current amount is taken out as a change in electrical resistance. Then, the external magnetic field from the recording medium is detected by taking out such a change in electrical resistance as a voltage change.

In the tunneling magnetoresistive sensor shown in FIG. 1, when the magnetized directions of the pinned magnetic layer 12 and the free magnetic layer 14 are parallel to each other, the conductance G (inverse number of resistance) is maximized and the tunnel current is also maximized. When the magnetized directions of the pinned magnetic layer 12 and the free magnetic layer 14 are antiparallel to each other, the conductance G is minimized and the tunnel current is also minimized.

Further, in the tunneling magnetoresistive sensor, a magnetoresistance change rate (TMR ratio; $\Delta R_{TMR}$) is expressed by $(G_{AP}^{-1} - G_P^{-1})/G_P^{-1}$. Herein, $G_{AP}$ represents a conductance (minimum value) resulting when the magnetized directions of the pinned magnetic layer 12 and the free magnetic layer 14 are antiparallel to each other. $G_P$ represents a conductance (maximum value) resulting when the magnetized directions of the pinned magnetic layer 12 and the free magnetic layer 14 are parallel to each other.

The above formula can be modified into;

$$\Delta R_{TMR} = 2P_P P_F/(1 - P_P P_F)$$

wherein $P_P$ represents a polarization rate of the pinned magnetic layer 12 and $P_F$ represents a polarization rate of the free magnetic layer 14.

As seen from the above formula, theoretically, the resistance change rate (TMR ratio) is governed by the polarization rates of the pinned magnetic layer 12 and the free magnetic layer 14, and it can be increased by increasing the polarization rates of the pinned magnetic layer 12 and the free magnetic layer 14. As a result, the resistance change rate is expected to be several to several tens of times those of GMR (giant magnetoresistive) sensors, such as a spin valve film, which have been mainly employed as reproduction heads in recent years.

A tunneling magnetoresistive sensor utilizes an effect that, even when an incoming electron from one ferromagnetic layer has only energy not enough to ride over an insulation barrier from the classical point of view, the electron is able to transit to another ferromagnetic layer on the opposite side through the insulation barrier; i.e., the tunnel effect based on the quantum theory.

According to the classical theory, assuming that the potential of an insulation barrier is V, the energy of the incoming electron is E, and a relationship of V>E holds, the incoming electron is not able to pass through the barrier of the potential V. However, it is experimentally proved that the incoming electron passes through the barrier of the potential V if certain conditions are satisfied in such a point that the insulation barrier has a thickness smaller than a certain value.

Figure 11:
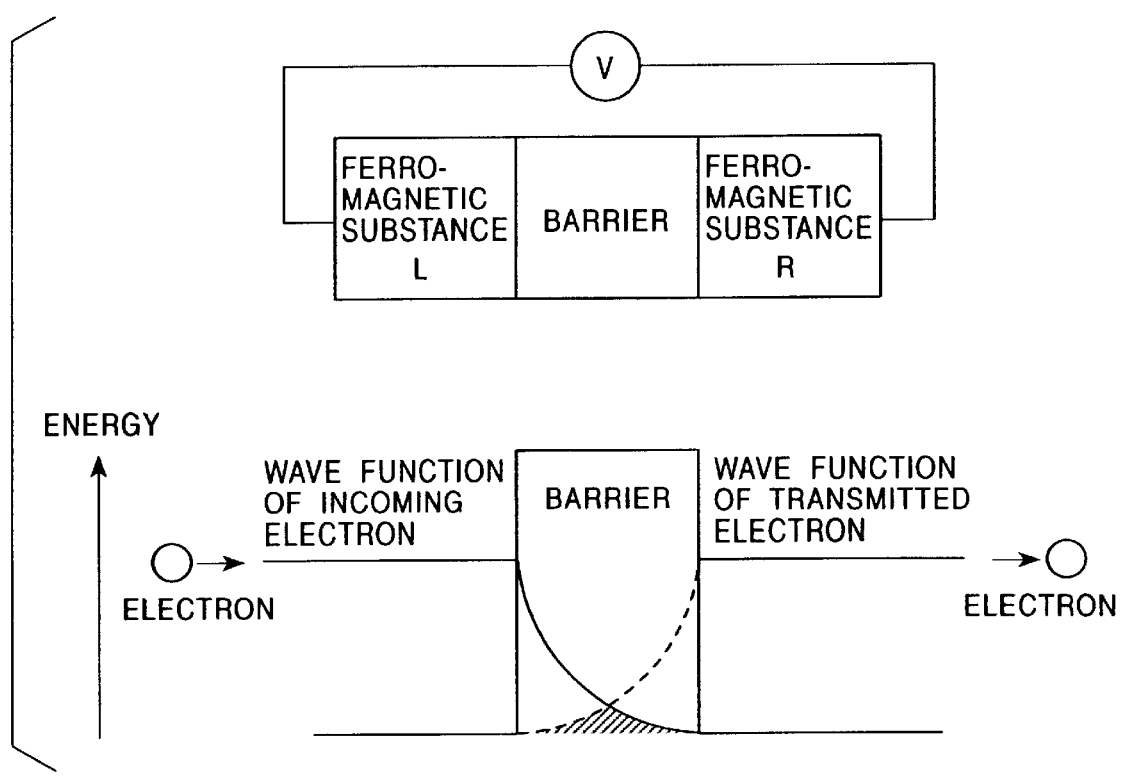
FIG. 11 is a schematic view for explaining the basic principle of tunnel effect of a tunneling magnetoresistive sensor comprising three-layered films of a ferromagnetic substance L, an insulation barrier, and a ferromagnetic substance R.

FIG. 11 is a schematic view for explaining the operation of a tunneling magnetoresistive sensor. An insulation barrier is interposed between a ferromagnetic substance L and a ferromagnetic substance R. Electrodes are connected respectively to the ferromagnetic substance L and the ferromagnetic substance R.

Even with the incoming electron having energy lower than the potential of the insulation barrier, the incoming electron is able to pass through the insulation barrier when the wave function of the incoming electron and the wave function of the transmitted electron overlap with each other in a range corresponding to the film thickness of the insulation barrier, as shown in FIG. 11. In that condition, the incoming electron passes through the insulation barrier and a tunnel current flows.

Based on the above-mentioned theory, when the wave function of the incoming electron and the wave function of the transmitted electron are not overlapped with each other, no tunnel current flows through the insulation barrier, and hence the tunnel effect is not developed. Whether both the wave functions overlap with each other depends on the film thickness of the insulation barrier. As the film thickness of the insulation barrier increases, a probability of both the wave functions overlapping with each other is reduced.

As described above, a tunneling magnetoresistive sensor has hitherto been constituted as a multilayered structure comprising three-layered films of a ferromagnetic layer, an insulation barrier layer, and a ferromagnetic layer. In order to develop the tunnel effect satisfactorily, it has been required to form the insulation barrier as a very thin film. From a practical point of view, however, a technical difficulty has been experienced in forming the insulation barrier as a very thin film.

In this embodiment, the insulation barrier layer 13 is formed using an insulating material expressed by the composition formula of Al—Si—O or Si—O—N. As a result, the dielectric strength and the developer resistance of the insulation barrier layer 13 are improved.

Accordingly, in spite of the insulation barrier layer 13 being formed as a very thin film, it is possible to obtain the insulation barrier layer 13 that is stable and is less susceptible to damages by an electric current and chemicals.

Also, addition of Si leads to another advantage that a thin film formed of an insulating material expressed by the composition formula of Al—Si—O has an improved dielectric withstand voltage in comparison with a thin film formed of alumina.

For example, $Al_{34.0}Si_{5.0}O_{61.0}$ having a film thickness of 30 nm has the dielectric withstand voltage of 7.7 MV/cm. As a comparison, the dielectric withstand voltage of alumina is 4.0 MV/cm.

A thin film formed of an insulating material expressed by the composition formula of Si—O—N has the dielectric withstand voltage, i.e., 13.0 MV/cm, higher than that of a thin film formed of an insulating material expressed by the composition formula of Al—Si—O.

It is thus understood that the insulation barrier layer 13, which is formed of an insulating material expressed by the composition formula of Al—Si—O or Si—O—N, has an improved dielectric withstand voltage in comparison with the case of using alumina to form it.

In particular, since the tunneling magnetoresistive sensor has high sensor resistance and a voltage is applied to the two ferromagnetic layers (the pinned magnetic layer 12 and the free magnetic layer 14), the insulation barrier layer 13 is subjected to a fairly large voltage. However, when the insulation barrier layer 13 is formed using an insulating material expressed by the composition formula of Al—Si—O or Si—O—N as with this embodiment, a probability that breakdown occurs in the insulation barrier layer 13 becomes smaller than that in the past.

Consequently, the magnetic sensor of this embodiment is able to operate in a stable manner.

Further, the developer resistance is improved in comparison with the case of using alumina. While the etching rate of alumina is about 50 Å/min, addition of Si reduces the etching rate of the Al—Si—O film from such a value. When the amount of Si added is about 9 at %, the etching rate is almost 0 Å/min.

When forming a magnetic head by using the magnetic sensor of this embodiment, in a process after forming the magnetic sensor shown in FIG. 1, a main electrode layer and an inductive head are formed on the electrode layer 10. When forming the main electrode layer and the inductive head, the process includes a step of forming a resist pattern. However, alumina is apt to dissolve in a strong alkaline developer, for example, which is used in the step of forming the resist pattern. Also, the etching rate of alumina is very high when the alumina is exposed to the developer.

Further, the magnetic head is mounted on a trailing end surface of a slider made of, e.g., alumina titanium carbide (Al—Ti—C). In a step of machining the slider after forming the magnetic head, the magnetic sensor is also exposed to liquids such as a cutting liquid and a lapping liquid. Because of the insulation barrier layer of the tunneling magnetoresistive sensor having a very small thickness, reliability of the product is greatly affected if, even though slightly, the insulation barrier layer dissolves in those liquids or its properties change.

By comparison, in this embodiment, since the insulation barrier layer 13 is formed using an insulating material expressed by the composition formula of Al—Si—O or Si—O—N, the developer resistance of the insulation barrier layer 13 becomes higher than conventional one.

Accordingly, in spite of the insulation barrier layer 13 being formed as a very thin film, the insulation barrier layer 13 can be obtained which is stable and is less susceptible to damages by chemicals.

The reason why the dielectric strength and the developer resistance of an Al—Si—O film are improved as compared with those of an alumina film is presumably in that addition of Si in an insulating material made of Al and O improves both the dielectric strength and the developer resistance on the basis of coupling between Si and O.

It is also confirmed that the insulation barrier layer 13 has smoothness substantially at the same level as that of an alumina film. Therefore, the insulation barrier layer 13 can be easily formed as a very thin film.

Additionally, the insulation barrier layer 13 has better heat radiation than an alumina film and contributes to reducing a DC resistance value of the magnetic sensor. Moreover, even when the current density increases as a result of higher recording density expected in the future, the insulation barrier layer 13 is able to suppress a rise of the sensor temperature satisfactorily.

The reason why the insulation barrier layer 13 has better heat radiation than an alumina film is presumably in that the atomic array of an Al—Si—O film has regularity at a short range. An alumina film structure is in a completely amorphous state. On the other hand, in the Al—Si—O film, as the amount of Si added increases, regularity at a short a range gradually occurs in the atomic array and crystallinity is improved.

Whether regularity at a short range occurs in the atomic array can be determined by observing a transmitted electron-beam diffraction image of a film.

The amount of Si added in an insulating material expressed by the composition formula of Al—Si—O or Si—O—N is preferably in the range of not less than 2 at % but not more than 9 at % with respect to the total.

Also, in this embodiment, when Si in an insulating material expressed by the composition formula of Al—Si—O or Si—O—N is calculated in terms of $SiO_2$ based on stoichiometry in relation to O, the calculated amount of $SiO_2$ is preferably in the range of not less than 10 at % but not more than 38 at % in the insulating material.

Stated otherwise, in this embodiment, when Si in an insulating material expressed by the composition formula of Al—Si—O or Si—O—N is calculated in terms of $SiO_2$ based on stoichiometry in relation to O, the calculated amount of $SiO_2$ is preferably in the range of not less than 6.1 mass % but not more than 26.0 mass % in the insulating material.

Further, the thickness of the insulation barrier layer 13 formed using an insulating material expressed by the composition formula of Al—Si—O or Si—O—N is preferably in the range of not less than 0.3 nm but not more than 2.0 nm and more preferably in the range of not less than 0.3 nm but not more than 1.0 nm. If the thickness of the insulation barrier layer 13 is set to a value less than 0.3 nm, it would be difficult to form the insulation barrier layer 13 as a uniform film capable of maintaining positive insulation between the pinned magnetic layer 12 and the free magnetic layer 14, and to obtain a magnetic sensor that operates in a stable manner.

If the thickness of the insulation barrier layer 13 is more than 2.0 nm, the sensor resistance would be too large and the magnetic sensor would be not suitable for practical use.

Moreover, in the magnetic sensor of this embodiment, the thickness of the insulation barrier layer 13 can be set to approximately 0.3 nm, and the DC resistance value of the magnetic sensor can be made much smaller than that of any conventional tunneling magnetoresistive sensor. More specifically, according to the present invention, the DC resistance value of the magnetic sensor can be increased to the order of several tens ohms ($\Omega$) that is comparable to those of conventional GMR sensors.

Accordingly, heat generation of the magnetic sensor can be suppressed and noise resistance of the magnetic sensor can be improved.

Figure 2:
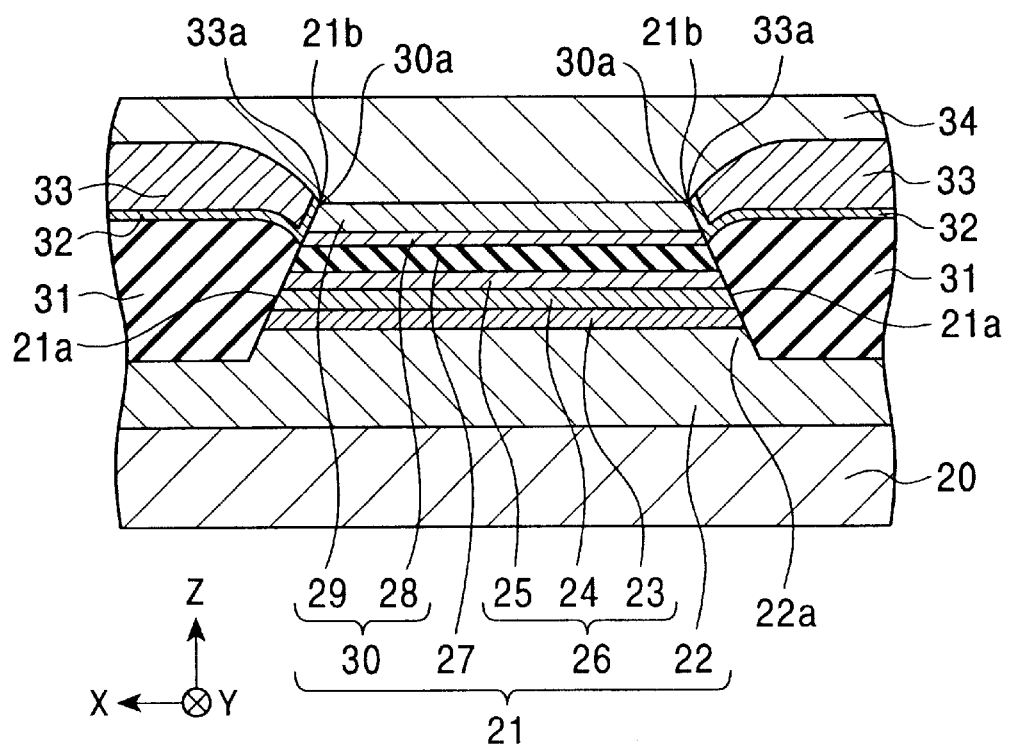
FIG. 2. is a partial sectional view of a magnetic sensor according to a second embodiment of the present invention, looking from the side facing a recording medium.

FIG. 2 is a partial sectional view of a magnetic sensor according to a second embodiment of the present invention, looking from the side facing a recording medium.

Numeral 20 denotes an electrode layer. The electrode layer 20 is formed of, e.g., Cu (copper), W (tungsten) and Cr (chromium).

A multilayered film 21 is formed on the electrode layer 20. Opposite lateral end surfaces 21a, 21a of the multilayered film 21 are formed as slopes having a width therebetween, which gradually increases toward the lower side in FIG. 2.

An antiferromagnetic layer 22 is formed on the electrode layer 20. The antiferromagnetic layer 22 is preferably formed of an X—Mn alloy (where X represents one or more elements selected from among Pt, Pd, Ir, Rh, Ru and Os). Particularly, it is preferable to select Pt among the elements represented by X and to employ a PtMn alloy as the antiferromagnetic layer 22.

Alternatively, the antiferromagnetic layer 22 may be formed of an X—Mn—X' alloy (where X' represents one or more elements selected from among Ne, Ar, Kr, Xe, Be, B, C, N, Mg, Al, Si, Pt, V, Cr, Fe, Co, Ni, Cu, Zn, Ga, Ge, Zr, Nb, Mo, Ag, Cd, Sn, Hf, Xa, W, Re, Au, Pb, and rare-earth elements).

The composition range of each of the X—Mn and X—Mn—X' alloys is preferably the same as that of the X—Mn and X—Mn—X' alloys, which are used to form the antiferromagnetic layer 22 of the magnetic sensor shown in FIG. 1.

The antiferromagnetic layer 22 has a raised portion 22a formed near its center and projecting in the Z-direction as shown. A pinned magnetic layer 26 comprising three layers is formed on the raised portion 22a.

The pinned magnetic layer 26 is constituted by forming a nonmagnetic layer 24 between an antiferromagnetic layer 23 and an antiferromagnetic layer 25.

The ferromagnetic layers 23, 25 are each formed of a film of, e.g., a NiFe alloy, Co, a CoNiFe alloy, or a CoFe alloy. Also, the nonmagnetic layer 24 is formed of, e.g., Ru, Rh, Ir, Cr, Re or Cu.

With heat treatment, an exchange coupling magnetic field is generated between the pinned magnetic layer 26 and the antiferromagnetic layer 22. Magnetized directions of the ferromagnetic. layers 23, 25 are put into an antiparallel state by the generated exchange coupling magnetic field. For example, the ferromagnetic layer 23 is magnetized in the Y-direction as shown, and the ferromagnetic layer 25 is magnetized in a direction opposed to the Y-direction. That antiparallel state is called a ferri-state. With that construction, magnetization of the pinned magnetic layer 26 can be maintained in a stable state, and the exchange coupling magnetic field generated at the interface between the pinned magnetic layer 26 and the antiferromagnetic layer 22 can be increased.

An insulation barrier layer 27 is formed on the pinned magnetic layer 26.

The insulation barrier layer 27 is formed using an insulating material expressed by the composition formula of Al—Si—O or Si—O—N.

Further, a free magnetic layer 30 having a two-layered structure is formed on the insulation barrier layer 27. One layer denoted by 28, i.e., a layer 28 formed on the side contacting the insulation barrier layer 27, is preferably formed of a Co or Co—Fe alloy film. The other layer 29 is formed of a film of, e.g., a NiFe alloy, a CoNiFe alloy, or a CoFe alloy. It is confirmed that the resistance change rate is improved by arranging a Co or Co—Fe film on the side contacting the insulation barrier layer 27.

On both sides of the multilayered film 21 in the track-width direction (X-direction as shown), insulating layers 31 are formed on the antiferromagnetic layer 22, and bias layers (domain control layer) 33 are formed on the insulating layers 31.

The insulating layers 31 are preferably formed of, e.g., AlO, $Al_2O_3$, $SiO_2$, $Xa_2O_5$, XiO, AlN, Al—Si—N, XiN, SiN, $Si_3N_4$, NiO, WO, $WO_3$, BN, CrN, SiON, or AlSiO.

The bias layers 33 formed on the insulating layers 31 with underlying layers 32 interposed therebetween have the function of aligning the magnetization of the free magnetic layer 30 in the track-width direction (X-direction). In the tunneling magnetoresistive sensor shown in FIG. 2, the bias layers 33 are each formed of a hard magnetic material, for example, a Co—Pt alloy film or a Co—Cr—Pt alloy film in practice.

The underlying layers 32 formed under the bias layers 33 have the function of aligning crystal orientation of the bias layers 33 and maintaining coercive forces. When the bias layers 33 are formed of a hard magnetic material as mentioned above, the underlying layers 32 are each formed of a film of, e.g., Cr, bcc-Fe or an Fe—Co alloy.

Then, an electrode layer 34 made of a similar material as that used for the electrode layer 20 is formed on the multilayered film 21 and the bias layers 33.

In the structure of the tunneling magnetoresistive sensor shown in FIG. 2, the bias layers 33 are formed so as to contact at least parts of opposite lateral end surfaces of the free magnetic layer 30 as viewed in the track-width direction (X-direction). With that arrangement, a bias magnetic field is supplied from the bias layers 33 to the lateral end surfaces of the free magnetic layer 30 as viewed in the track-width direction, whereby the magnetization of the free magnetic layer 30 is aligned in the X-direction.

Additionally, when the bias layers 33 are formed of a hard magnetic material, a part of the insulating layer 31 may enter the joining interface between the lateral end surface of the free magnetic layer 30 and the bias layer 33 on condition that such a part of the insulating layer 31 has a thickness of not larger than about 10 nm.

In order to form the bias layer 33 in contact with a part of corresponding one of the opposite lateral end surfaces of the free magnetic layer 30, it is at least required that an upper surface end 31a of the insulating layer 31, which is formed below the bias layer 33, on the side adjoining the multilayered film 21 must be positioned at a level lower than a corresponding upper surface end 30a of the free magnetic layer 30 as viewed in the drawing.

Furthermore, in the embodiment shown in FIG. 2, upper surface ends 33a of the bias layers 33 on each side adjoining the multilayered film 21 are coincident with upper surface opposite ends 21b of the multilayered film 21, and the bias layers 33 are formed such that they will not extend over an upper surface of the multilayered film 21.

If the bias layers 33 are extended over the upper surface of the multilayered film 21, a magnetostatic field generated from extended end portions of the bias layers 33 in a direction opposed to the magnetized direction of the free magnetic layer 30 would enter the free magnetic layer 30.

With the arrangement of this embodiment in which the upper surface ends 33a of the bias layers 33 are coincident with the upper surface opposite ends 21b of the multilayered film 21, a magnetostatic filed in a direction opposed to the magnetized direction of the free magnetic layer 30 is avoided from entering the free magnetic layer 30, whereby the domain structure of the free magnetic layer 30 is stabilized and can be easily brought into a single domain state.

It is therefore possible to suppress instability of the reproduced waveform, to reduce Barkhausen noise, and to uniformly form a reproduction gap within a width of the multilayered film 21 as viewed in the track-width direction.

Also, in this embodiment, since the insulating layers 31 are formed, as shown in FIG. 2, on both sides of the multilayered film 21 in the track-width direction (X-direction), a sensing current supplied from the electrode layers 20, 34 is hardly shunt and properly flows through the multilayered film 21 in the Z-direction. As a result, a reproduction output of the sensor can be improved.

Moreover, in this embodiment, the insulation barrier layer 27 is formed using an insulating material expressed by the composition formula of Al—Si—O or Si—O—N for improving dielectric strength, developer resistance, smoothness, and heat radiation of the insulation barrier layer 27.

Figure 3:
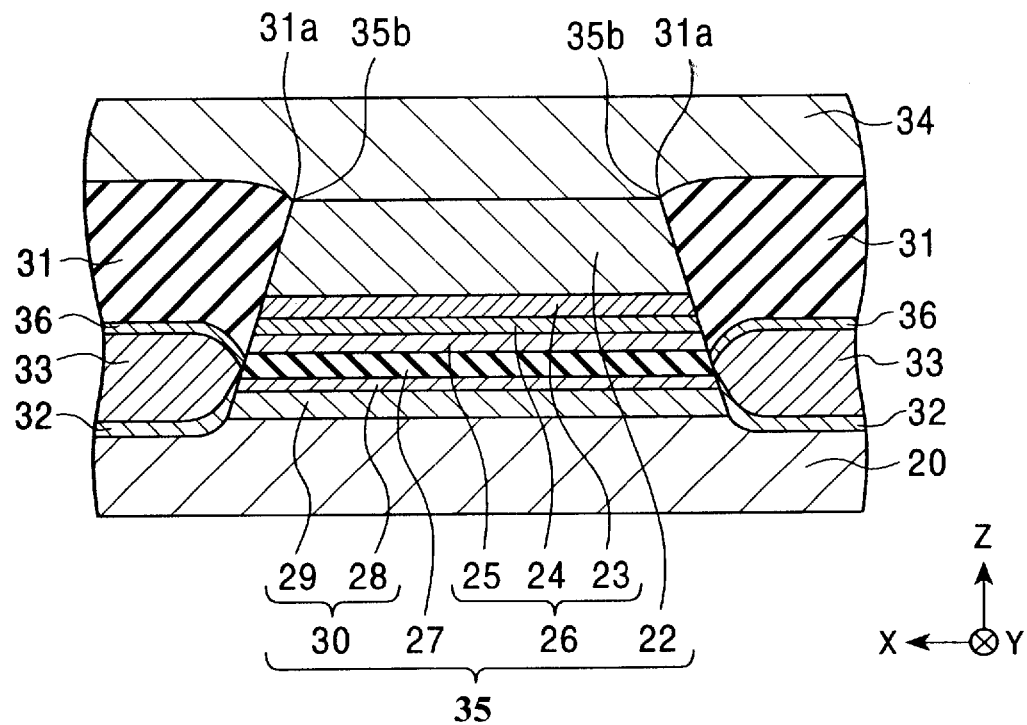
FIG. 3 is a partial sectional view of a magnetic sensor according to a third embodiment of the present invention, looking from the side facing a recording medium.

FIG. 3 is a partial sectional view of a magnetic sensor according to a third embodiment of the present invention, looking from the side facing a recording medium.

As shown in FIG. 3, a multilayered film 35 is formed on an electrode layer 20. Layers constituting the multilayered film 35 are successively formed in the order reversal to that of the multilayered film 21 shown in FIG. 2.

More specifically, a free magnetic layer 30, an insulation barrier layer 27, a pinned magnetic layer 26, and an antiferromagnetic layer 22 are formed in that order from the lower side. Materials of the respective layers are the same as those in the magnetic sensor of FIG. 2.

The insulation barrier layer 27 is formed using an insulating material expressed by the composition formula of Al—Si—O or Si—O—N.

On both sides of the multilayered film 35 in the track-width direction (X-direction as shown), bias layers 33 are formed on the electrode layer 20 through an underlying layer 32 formed of a Cr film, for example. Crystal orientation of the bias layers 33 is aligned by the presence of the underlying layers 32, and coercive forces of the bias layers 33 are maintained. Therefore, satisfactory hard magnetic characteristics of the bias layers 33 are maintained.

The bias layers 33 are formed so as to contact at least parts of opposite lateral end surfaces of the free magnetic layer 30. With that arrangement, a bias magnetic field is supplied from the bias layers 33 to the lateral end surfaces of the free magnetic layer 30 as viewed in the track-width direction (X-direction), whereby the magnetization of the free magnetic layer 30 is aligned in the X-direction.

Further, insulating layers 31 are formed on the bias layers 33 with a nonmagnetic intermediate layer 36 of Ta, for example, interposed therebetween. Note that the nonmagnetic intermediate layer 36 need not necessarily be formed.

The insulating layers 31 are formed not to extend over an upper surface of the multilayered film 35, and upper surface ends 31a of the insulating layers 31 on each side adjoining the multilayered film 35 are coincident with upper surface opposite ends 35b of the multilayered film 35.

A reproduction gap can be formed at a uniform length within a width of the multilayered film 35 as viewed in the track-width direction, and reproduction characteristics can be maintained at a satisfactory level.

Also, in this embodiment, since the insulating layers 31 are formed on both sides of the multilayered film 35 in the track-width direction, a sensing current supplied from the electrode layers 20, 34 is hardly shunt and properly flows through the multilayered film 35 in the Z-direction. As a result, satisfactory reproduction characteristics can be maintained.

With the structure shown in FIG. 3, the bias layers 33 can be easily formed in contact with the opposite lateral end surfaces of the free magnetic layer 30, and the domain structure of the free magnetic layer 30 is stabilized. It is hence possible to suppress instability of the reproduced waveform and to reduce Barkhausen noise.

In this embodiment, the insulation barrier layer 27 is likewise formed using an insulating material expressed by the composition formula of Al—Si—O or Si—O—N for improving dielectric strength, developer resistance, smoothness, and heat radiation of the insulation barrier layer 27.

Figure 4:
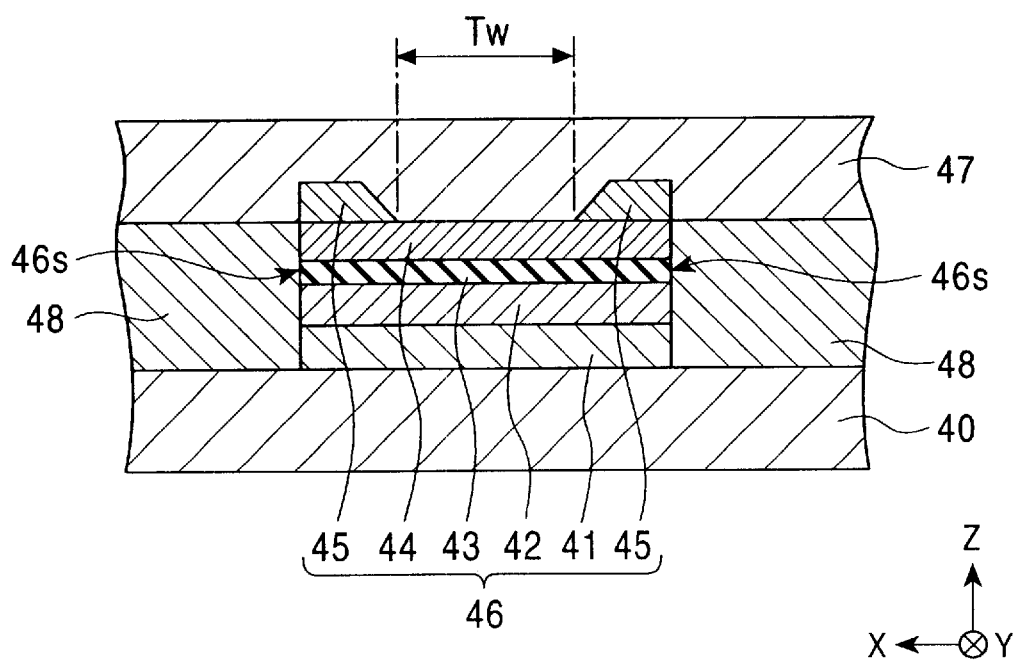
FIG. 4 is a partial sectional view of a magnetic sensor according to a fourth embodiment of the present invention, looking from the side facing a recording medium.

FIG. 4 is a partial sectional view of a magnetic sensor according to a fourth embodiment of the present invention, looking from the side facing a recording medium.

In the magnetic sensor shown in FIG. 4, a multilayered film 46 is formed on an electrode layer 40 by successively forming a first antiferromagnetic layer 41, a pinned magnetic layer 42, an insulation barrier layer 43, a free magnetic layer 44, and a pair of second antiferromagnetic layers 45, 45 in that order. Opposite lateral end surfaces 46s, 46s of the multilayered film 46 are formed vertically with respect to a surface of the electrode layer 40. Another electrode layer 47 is formed on the multilayered film 46.

On both sides of the multilayered film 46, a pair of insulating layers 48, 48 made of alumina, for example, are formed between the two electrode layers 40 and 47.

Respective materials of the electrode layer 40, the first antiferromagnetic layer 41, the pinned magnetic layer 42, the free magnetic layer 44, and the electrode layer 47 are the same as those used to form the electrode layer 10, the antiferromagnetic layer 11, the pinned magnetic layer 12, the free magnetic layer 14, and the electrode layer 10 of the magnetic sensor shown in FIG. 1.

The insulation barrier layer 43 is formed using an insulating material expressed by the composition formula of Al—Si—O or Si—O—N.

The magnetic sensor shown in FIG. 4 is the so-called exchange biasing magnetic sensor in which the second antiferromagnetic layers 45, 45 are formed on the free magnetic layer 44 and magnetization of the free magnetic layer 44 is aligned in the X-direction, as shown, by exchange anisotropic magnetic fields developed between the free magnetic layer 44 and the second antiferromagnetic layers 45, 45.

Also, the magnetized direction of the pinned magnetic layer 42 is aligned in the Y-direction, as shown, by an exchange anisotropic magnetic field developed between the pinned magnetic layer 42 and the antiferromagnetic layer 41.

The second antiferromagnetic layers 45, 45 are each formed of a Pt—Mn alloy, an X—Mn alloy (where X represents one or more elements selected from among Pd, Ir, Rh, Ru and Os), or a Pt—Mn—X' alloy (where X' represents one or more elements selected from among Pd, Ir, Rh, Ru, Au, Ag, Os, Cr, Ni, Ar, Ne, Xe and Kr).

In the PtMn alloy and the alloy expressed by the formula X—Mn, which are employed to form the second antiferromagnetic layers 45, 45, Pt or X is preferably in the range of 37–63 at %. Also, in the alloy expressed by the formula Pt—Mn—X', X'+Pt is preferably in the range of 37–63 at %. Further, in the alloy expressed by the formula Pt—Mn—X', X' is preferably in the range of 0.2–10 at %. Additionally, when X' is one or more elements selected from among Pd, Ir, Rh, Ru, Os, Ni and Fe, X' is preferably in the range of 0.2–40 at %. Note that unless particularly otherwise specified, upper and lower limits of the numerical range denoted by using a mark "–" represent respective. values that are equal to or more and less than indicated numerals.

The spacing between the second antiferromagnetic layers 45, 45 corresponds to a track width Tw.

In the magnetic sensor of this embodiment, no dead zone occurs in an area corresponding to the track width (optical track width) Tw set when forming the magnetic sensor. It is therefore possible to suppress a decrease in reproduction output that is otherwise caused when the track width Tw of the magnetic sensor is reduced to be adapted for higher recording density.

Further, since the opposite lateral end surfaces 46s, 46s of the multilayered film 46 in the magnetic sensor of this embodiment are formed vertically with respect to the track-width direction, a variation in length of the free magnetic layer 44 in the track-width direction can be suppressed.

Also, with the structure shown in FIG. 4, since the insulating layers 48, 48 are formed on both sides of the multilayered film 46, a sensing current supplied from the electrode layers 40, 47 is hardly shunt and properly flows through the multilayered film 46.

In each of the magnetic sensors according to the embodiments of the present invention shown in FIGS. 2, 3 and 4, the insulation barrier layer 27, 43 is formed using an insulating material expressed by the composition formula of Al—Si—O or Si—O—N.

Therefore, the insulation barrier layer 27, 43 is able to maintain improved insulation resistance.

Consequently, in spite of the insulation barrier layer 27, 43 being formed as a very thin film, it is possible to form the insulation barrier layer 27, 43, which is stable and is less susceptible to damages by an electric current.

In addition, the developer resistance of the insulation barrier layer 27, 43 is improved.

Accordingly, the insulation barrier layer 27, 43 can be obtained which is stable and is less susceptible to damages by chemicals in a process after forming each of the magnetic sensors shown in FIGS. 2 to 4, specifically in a step of forming a main electrode layer and an inductive head on the electrode layer 34, 47 or in a step of machining a slider on which the magnetic sensor is mounted.

As a result, the magnetic sensors of those embodiments are able to operate as tunneling magnetoresistive sensors in a stable manner.

Moreover, the insulation barrier layer 27, 43 has good smoothness so that it can be easily formed as a very thin film.

Furthermore, the insulation barrier layer 27, 43 has better heat radiation than an alumina film and contributes to reducing a DC resistance value of the magnetic sensor. Even when the current density increases as a result of higher recording density expected in the future, the insulation barrier layer 27, 43 is able to suppress a rise of the sensor temperature satisfactorily.

The amount of Si added in an insulating material, which is used to form the insulation barrier layer 27, 43 and is expressed by the composition formula of Al—Si—O or Si—O—N, is preferably in the range of not less than 2 at % but not more than 9 at % with respect to the total.

Also, when Si in an insulating material expressed by the composition formula of Al—Si—O or Si—O—N is calculated in terms of $SiO_2$ based on stoichiometry in relation to O, the calculated amount of $SiO_2$ is preferably in the range of not less than 10 at % but not more than 38 at % in the insulating material.

Stated otherwise, when Si in an insulating material expressed by the composition formula of Al—Si—O or Si—O—N is calculated in terms of $SiO_2$ based on stoichiometry in relation to O, the calculated amount of $SiO_2$ is preferably in the range of not less than 6.1 mass % but not more than 26.0 mass % in the insulating material.

The thickness of the insulation barrier layer 27, 43, which is formed using an insulating material expressed by the composition formula of Al—Si—O or Si—O—N, is preferably in the range of not less than 0.3 nm but not more than 2.0 nm. More preferably, the thickness of the insulation barrier layer 27, 43 is in the range of not less than 0.3 nm but not more than 1.0 nm.

Also, in each of the magnetic sensors shown in FIGS. 2 to 4, the thickness of the insulation barrier layer 27, 43 can be set to approximately 0.3 nm, and the DC resistance value of the magnetic sensor can be made much smaller than that of any conventional tunneling magnetoresistive sensor. More specifically, the DC resistance value of the magnetic sensor, i.e., the tunneling magnetoresistive sensor, can be increased to the order of several tens of ohms (Ω), which is comparable to those of conventional GMR sensors.

Accordingly, heat generation of the magnetic sensor can be suppressed and noise resistance of the magnetic sensor can be improved.

A method for manufacturing the magnetic sensor shown in FIG. 2 will be described below.

Figure 5:
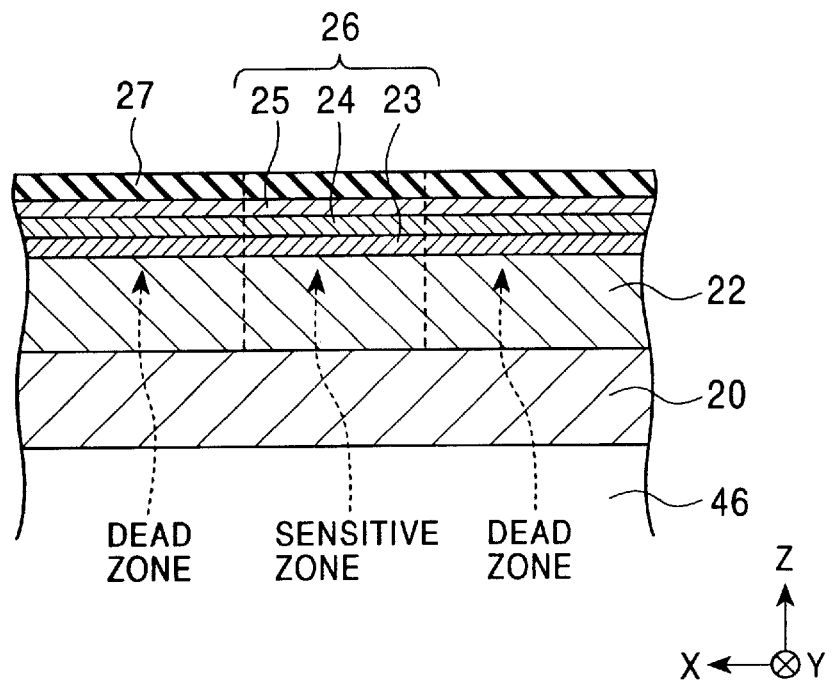
FIG. 5 is a sectional view showing one step of manufacturing the magnetic sensor shown in FIG. 2.

In a step shown in FIG. 5, the electrode layer 20, the antiferromagnetic layer 22, and the pinned magnetic layer 26 are successively formed as uniform films on the substrate 46 in the same vacuum film-forming apparatus by a thin-film forming process such as sputtering or vapor deposition.

Similar materials to those described above in connection with FIG. 2 are used to form the electrode layer 20 and the antiferromagnetic layer 22.

In FIG. 5, the pinned, magnetic layer 26 is formed as a three-layered film in a ferri-state. For example, the ferromagnetic layers 23, 25 are each formed of a CoFe film and the nonmagnetic layer 24 is formed of a Ru film.

Then, on the pinned magnetic layer 26, the insulation barrier layer 27 is formed using an insulating material expressed by the composition formula of Al—Si—O or Si—O—N.

When forming the insulation barrier layer 27 using an insulating material expressed by the composition formula of Al—Si—O, a target made of AlSi is used, by way of example, as a sputtering target. In this case, the target does not contain O (oxygen). To make oxygen contained in the insulation barrier layer 27 to be formed by sputtering, therefore, an $O_2$ gas is introduced to a sputtering apparatus in addition to an Ar gas so that an Al—Si—O film is formed by the reactive sputtering process.

With this manufacturing method, when forming the AlSi target, the Si content can be adjusted just in consideration of a ratio with respect to the Al content. Also, by adjusting the amount of introduced $O_2$ gas, the sputtering power and so on, an Al—Si—O film can be easily formed which contains Si in the range of not less than 2 at % but not more than 9 at % with respect to the total.

The present invention is not limited to the above-described manufacturing method, and a sintered target made of Al—Si—O and having a composition ratio adjusted to be held within a predetermined range beforehand may be used as the sputtering target. In such a case, only an active Ar gas may be introduced, or an $O_2$ gas may also be introduced for proper adjustment of the composition ratio of O.

Alternatively, the Al—Si—O film may be formed using a composite target comprising a target made of $Al_2O_3$ and a target made of $SiO_2$. In the case of using those plural targets, the sputtering power applied to each target is adjusted to change the amount of ions sputtered from the target so that an Al—Si—O film is formed which contains Si in the range of not less than 2 at % but not more than 9 at % with respect to the total.

As an alternative, the Al—Si—O film may be obtained by preparing an AlSi target having the Si content adjusted in relation to a ratio to the Al content, forming an AlSi film on the pinned magnetic layer 26 by the sputtering process such as DC sputtering, and then oxidizing the AlSi film.

The AlSi film can be oxidized by a method of naturally oxidizing the film in an $O_2$ gas, a method of oxidizing the film in an $O_2$ plasma, or a method of withdrawing $O_2$ radicals from an $O_2$ plasma and oxidizing the film in the $O_2$ radicals.

In particular, the method of oxidizing the AlSi film in $O_2$ radicals is preferable in that it is easy to properly adjust the oxidizing rate and to uniformly oxidize the AlSi film.

With the method of obtaining the Al—Si—O film by oxidizing the AlSi film, when forming the AlSi target, the Si content can be adjusted just in consideration of a ratio with respect to the Al content. Also, by adjusting the amount of introduced $O_2$ gas, $O_2$ plasma or $O_2$ radicals, etc., an Al—Si—O film can be easily formed which contains Si in the range of not less than 2 at % but not more than 9 at % with respect to the total.

When forming the insulation barrier layer 27 using an insulating material expressed by the composition formula of Si—O—N, a target made of Si is used, by way of example, as the sputtering target. In this case, the target contains neither O (oxygen) nor N (nitrogen). To make oxygen and nitrogen contained in the insulation barrier layer 27 to be formed by sputtering, therefore, an $O_2$ gas and an $N_2$ gas are introduced to a sputtering apparatus in addition to an Ar gas so that a Si—O—N film is formed by the reactive sputtering process.

The present invention is not limited to the above-described manufacturing method, and a sintered target made of Si—O—N and having a composition ratio adjusted to be held within a predetermined range beforehand may be used as the sputtering target. In such a case, only an active Ar gas may be introduced, or an $O_2$ gas and an $N_2$ gas may also be introduced for proper adjustment of the composition ratios of O and N.

Alternatively, the Si—O—N film may be formed using a composite target comprising a target made of $SiO_2$ and a target made of SiN.

As an alternative, the Si—O—N film may be formed by the reactive sputtering process using a target made of $SiO_2$, while an $N_2$ gas is introduced to the sputtering apparatus in addition to an Ar gas. Also, the Si—O—N film may be formed by the reactive sputtering process using a target made of SiN, while an $O_2$ gas is introduced to the sputtering apparatus in addition to an Ar gas.

Further, the Si—O—N film may be obtained by preparing a SiN target, forming a SiN film on the pinned magnetic layer 26 by the sputtering process such as DC sputtering, and then oxidizing the SiN film.

The SiN film can be oxidized by a method of naturally oxidizing the film in an $O_2$ gas, a method of oxidizing the film in an $O_2$ plasma, or a method of withdrawing $O_2$ radicals from an $O_2$ plasma and oxidizing the film in the $O_2$ radicals.

In particular, the method of oxidizing the SiN film in $O_2$ radicals is preferable in that it is easy to properly adjust the oxidizing rate and to uniformly oxidize the SiN film.

Furthermore, the Si—O—N film or the Al—Si—O film may be formed by the chemical vapor deposition process.

The Si—O—N film or the Al—Si—O film formed on the pinned magnetic layer 26 by any of the above-described methods serves as the insulation barrier layer 27.

According to the manufacturing method of this embodiment, the Si—O—N film or the Al—Si—O film serving as the insulation barrier layer 27 can be formed in a thickness in the range of not less than 0.3 nm but not more than 2.0 nm, particularly in the range of not less than 0.3 nm but not more than 1.0 nm.

Subsequently, the free magnetic layer 30 is formed as a two-layered film on the insulation barrier layer 27. For example, one layer denoted by 28 is formed of a Co film and the other layer 29 is formed of a NiFe alloy film.

Figure 6:
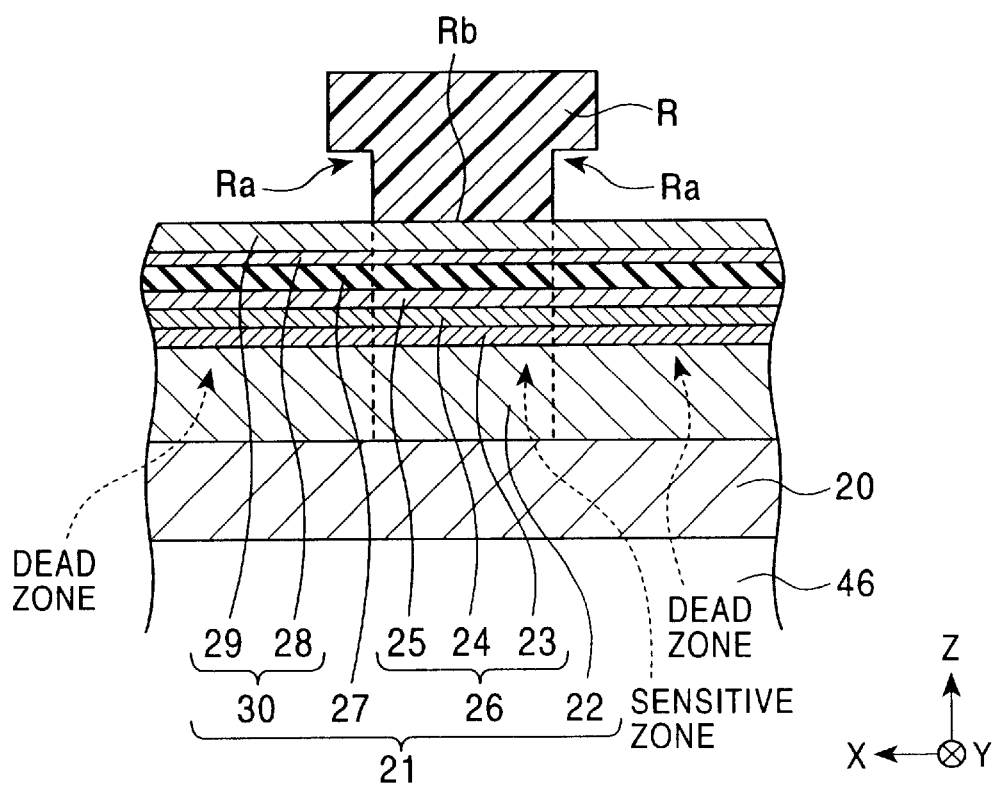
FIG. 6 is a sectional view showing another step of manufacturing the magnetic sensor shown in FIG. 2.

A multilayered structure from the antiferromagnetic layer 22 to the free magnetic layer 30 constitutes the multilayered film 21 shown in FIG. 6. A protective barrier layer made of Ta, for example, may be provided on the free magnetic layer 30.

Then, as shown in FIG. 6, a lift-off resist layer R having a pair of opposite undercuts Ra, Ra formed in the underside thereof is formed on the free magnetic layer 30. A width of a lower surface Rb of the resist layer R, as viewed in the track-width direction (X-direction as shown), is formed equal to or larger than the width of a sensitive zone of the multilayered film 21. The sensitive zone and the dead zone are measured based on the micro-track profile method. The width of the sensitive zone in the track-width direction (X-direction) is already decided in the stage before the step of forming the resist layer R.

Figure 7:
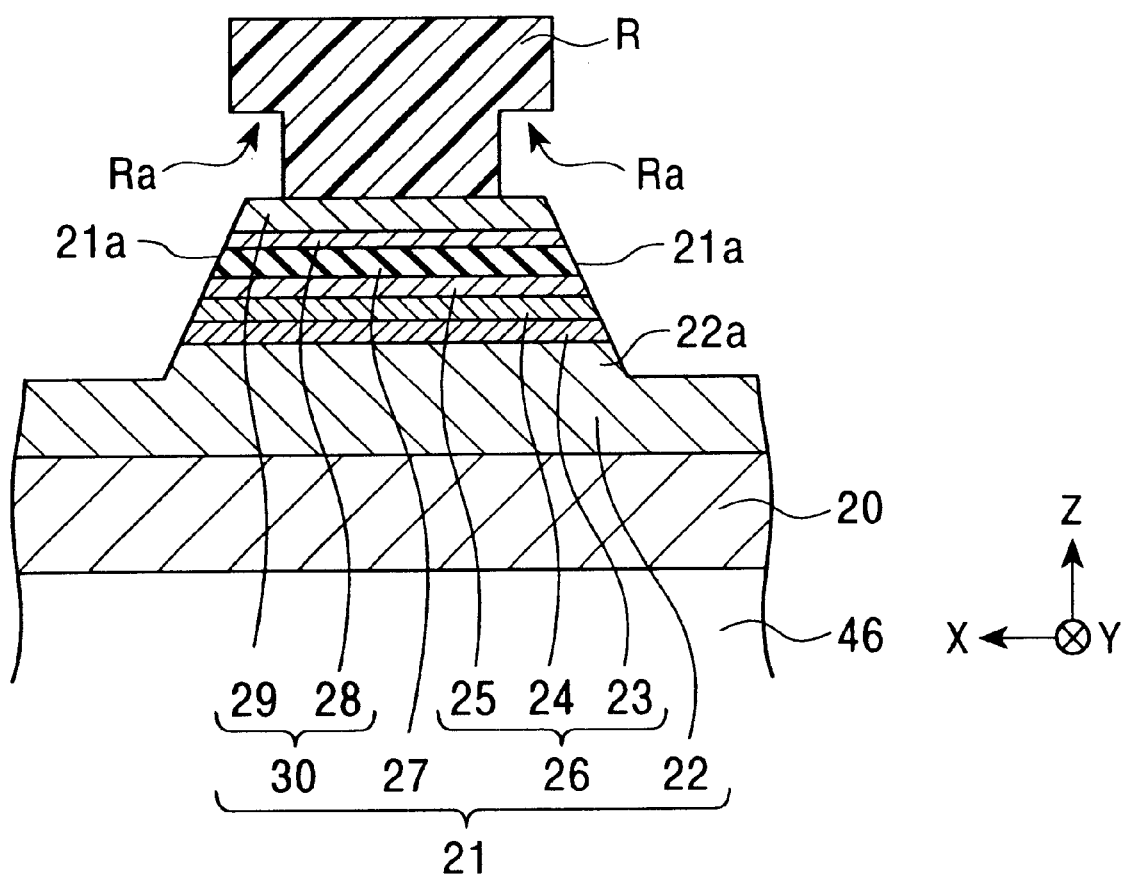
FIG. 7 is a sectional view showing still another step of manufacturing the magnetic sensor shown in FIG. 2.

Then, in a step shown in FIG. 7, dry etching such as ion milling is performed to remove portions of the multilayered film 21 on both sides of a central portion thereof covered by the resist layer R, as viewed in the track-width direction (X-direction), while leaving at least the central covered portion of the multilayered film 21.

At that time, as shown in FIG. 7, the antiferromagnetic layer 22 is etched halfway to form the raised portion 22a near the center of the antiferromagnetic layer 22. Also, with the above-mentioned etching, the opposite lateral end surfaces 21a, 21a of the multilayered film 21, as viewed in the track-width direction, are formed as slopes having a width therebetween, which gradually increases toward the antiferromagnetic layer 22.

Figure 8:
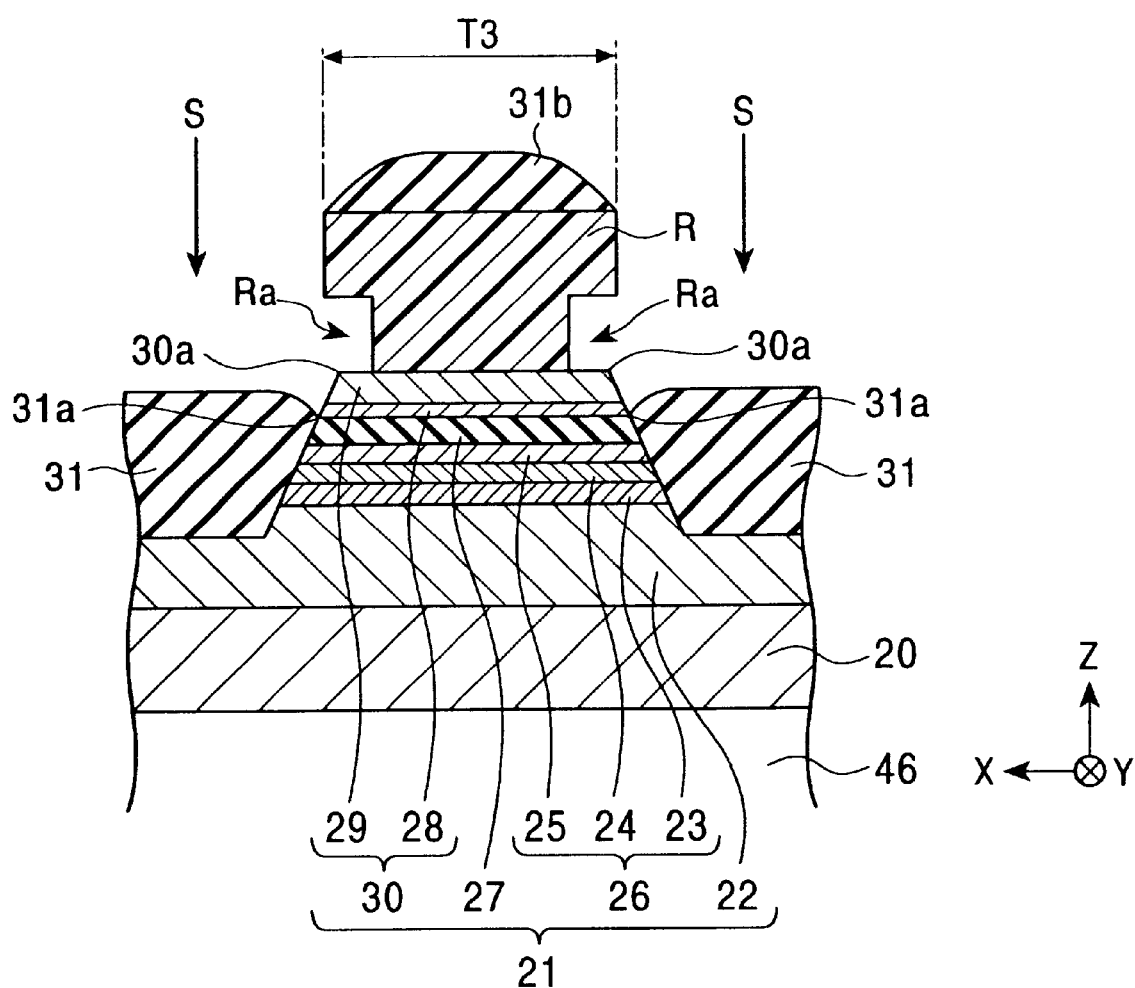
FIG. 8 is a sectional view showing still another step of manufacturing the magnetic sensor shown in FIG. 2.

Then, in a step shown in FIG. 8, the insulating layers 31 are formed on the antiferromagnetic layer 22 on both sides of the multilayered film 21 as viewed in the track-width direction. The insulating layers 31 are formed by positioning a target within a sputtering apparatus to face the substrate 46 substantially in a parallel relation, and carrying out sputtering in a direction S. The sputtering apparatus is preferably operated with, for example, ion beam sputtering, long-throw sputtering or collimation sputtering, which is able to produce sputtered particles at high straightforwardness.

The direction S is preferably vertical or almost vertical with respect to the substrate 46. By so setting the direction S, the insulating layers 31 are not formed on opposite end portions of the. multilayered film 21, which are concealed by the resist layer R when looking from right above the multilayered film 21.

In other words, properly adjusting a maximum width T3 of the resist layer R in the track-width direction, a target sputtering time, etc., makes it possible to change the position and the film thickness of each of the insulating layers 31 formed on the opposite lateral end surfaces of the multilayered film 21.

In the present invention, the bias layers 33 formed on the insulating layers 31 must be formed in contact with at least parts of the opposite lateral end surfaces of the free magnetic layer 30 in the track-width direction.

To realize that structure, the insulating layers 31 must be formed such that the upper surface end 31a of each insulating layer 31 on the side adjoining the multilayered film 21 is positioned lower than the corresponding upper surface end 30a of the free magnetic layer 30.

To that end, the maximum width T3 of the resist layer R in the track-width direction is set to be equal to, or slightly smaller than, or larger than the width of a lower surface of the free magnetic layer 30 (i.e., the width of a lower surface of the layer denoted by 28 in FIG. 2) so that, when looking the multilayered film 21 from right above, the opposite lateral end surfaces of the free magnetic layer 30 do not appear in entirety (they may partly appear).

Thus, when the resist layer R having the properly adjusted maximum width T3 is formed on the free magnetic layer 30 and the insulating layers 31 are formed on both sides of the multilayered film 21 in the track-width direction, the opposite lateral end surfaces of the free magnetic layer 30 are not completely covered with the insulating layers 31. Stated otherwise, in a state after forming the insulating layers 31, at least parts of the opposite lateral end surfaces of the free magnetic layer 30 remain exposed.

In the step shown in FIG. 8, an insulating material layer 31b made of the same material as the insulating layers 31 is formed on the resist layer R.

Figure 9:
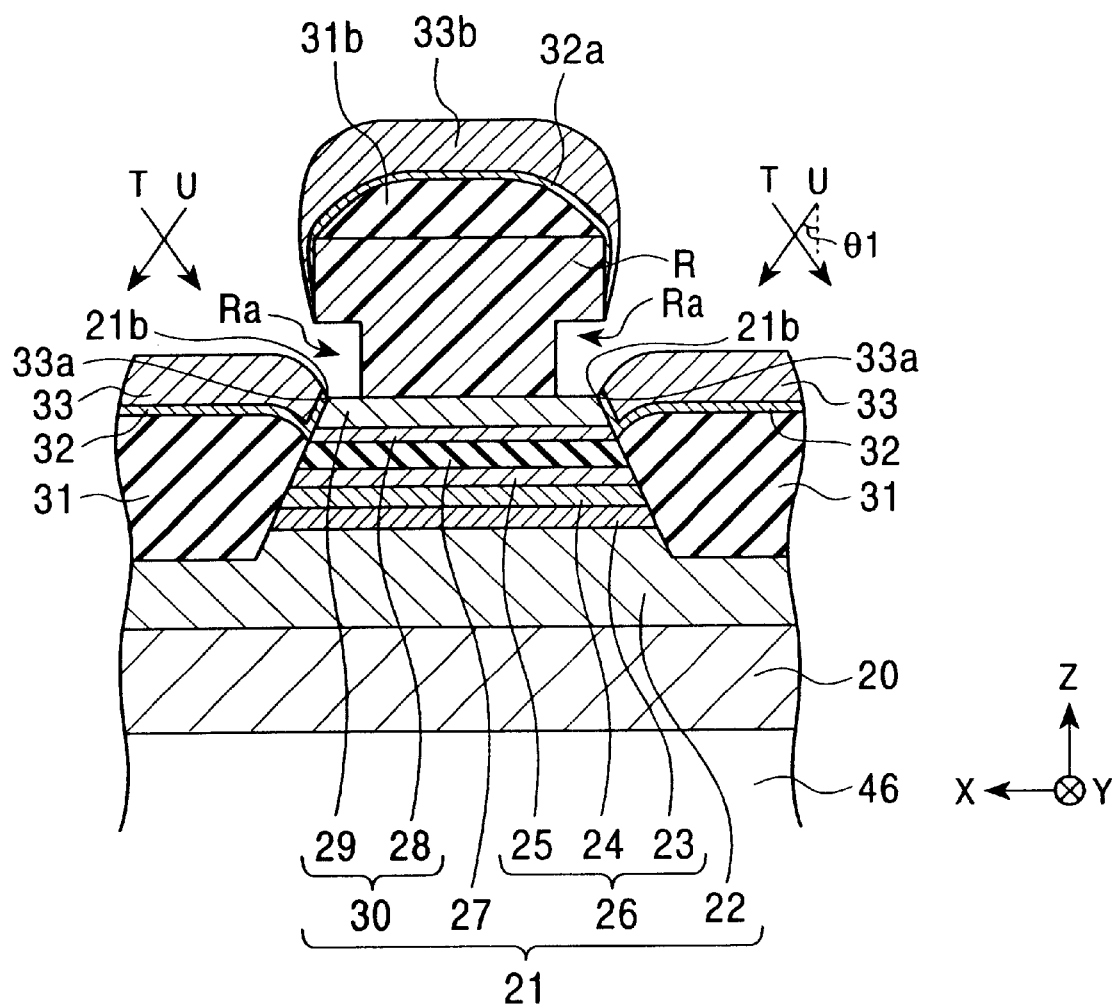
FIG. 9 is a sectional view showing still another step of manufacturing the magnetic sensor shown in FIG. 2.

Then, in a step shown in FIG. 9, the underlying layers 32 and the bias layers 33 are formed by sputtering in oblique directions with respect to the substrate 46.

The sputtering in the oblique directions is carried out by positioning the substrate 46 obliquely with respect to the target, or by positioning the target obliquely with respect to the substrate 46. The sputtering directions are set, as shown in FIG. 9, to be directions T and U inclined θ1 with respect to the direction vertical to the substrate 46. The inclination θ1 is preferably in the range of 20 to 50°.

With the sputtering performed in the oblique directions, the bias layers 33 are properly formed on even the opposite lateral end surfaces of the free magnetic layer 30 in the track-width direction (X-direction), which are concealed by the resist layer R when looking the multilayered film 21 from right above.

Since at least parts of the opposite lateral end surfaces of the free magnetic layer 30 remain exposed in the stage after forming the insulating layers 31 on both sides of the multilayered film 21 as described above, the bias layers 33 can be formed in contact with the exposed parts of the opposite lateral end surfaces of the free magnetic layer 30. Hence, a bias magnetic field applied from the bias layers 33 can be properly supplied to the free magnetic layer 30.

Further, in the step shown in FIG. 9, by properly adjusting the sputtering directions T, U when forming the underlying layers 32 and the bias layers 33, it is possible to change the position at which, in particular, the upper surface end 33a of each bias layer 33 on the side adjoining the multilayered film 21 is to be formed.

In the step shown in FIG. 9, the sputtering directions T and U, the sputtering time, etc. are properly adjusted such that the upper surface end 33a of each bias layer 33 on the side adjoining the multilayered film 21 is coincident with the corresponding one of the upper surface opposite ends 21b of the multilayered film 21.

The underlying layers 32 and the bias layers 33 formed in this step are not extended over the upper surface of the multilayered film 21, as shown in FIG. 9.

As a result of forming the underlying layers 32 and the bias layers 33 by sputtering, an underlying material layer 32a and a bias material layer 33b made of respectively the same materials as the underlying layers 32 and the bias layers 33 are formed on the insulating material layer 31b already formed on the resist layer R.

Subsequently, the resist layer R is peeled off from the multilayered film 21. Since the undercuts Ra are formed in the underside of the resist layer R, the resist layer R can be easily removed by applying a peeling-off liquid to permeate into the boundary between the resist layer R and the multilayered film 21 through the undercuts Ra.

Figure 10:
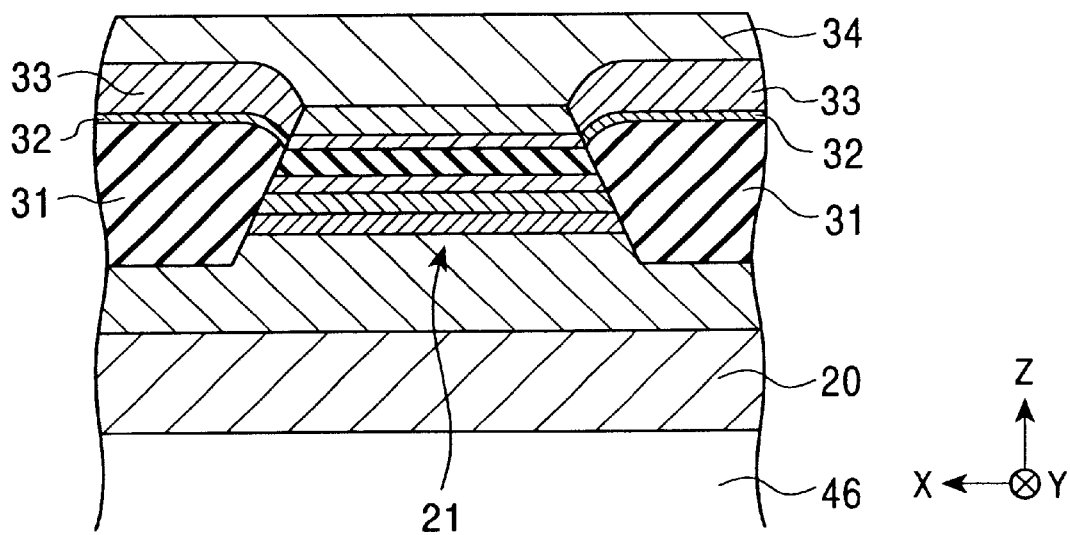
FIG. 10 is a sectional view showing still another step of manufacturing the magnetic sensor shown in FIG. 2.

Then, as shown in FIG. 10, the electrode layer 34 is formed on the upper surface of the multilayered film 21 and the upper surfaces of the bias layers 33.

When constructing a magnetic head by using any of the magnetic sensors shown in FIGS. 1 to 4, an underlying layer made of an insulating material, such as alumina, is formed on a substrate, a lower shield layer made of a magnetic alloy is formed on the underlying layer, and a lower gap layer made of an insulating material is formed on the lower shield layer. Any of the magnetic sensors shown in FIGS. 1 to 4 is formed on the underlying gap layer. Further, an upper gap layer made of an insulating material is formed on the magnetic sensor, and an upper shield layer made of a magnetic alloy is formed on the upper gap layer. In addition, an inductive head for writing may be formed on the upper shield layer.

<Examples>

Experiments were conducted on dielectric strength and developer resistance of an Al—Si—O film or a Si—O—N film.

First, an Al—Si—O film having a film thickness of 30 nm and a composition ratio of $Al_{34.0}S_{5.0}O_{61.0}$ (each numeral represents a value in at %) and a Si—O—N film having a film thickness of 30 nm and a composition ratio of $Si_{35.0}O_{62.0}N_{3.0}$ were formed. An $Al_2O_3$ film and an Al—Si—N film, each having a film thickness of 30 nm, were formed as Comparative Examples.

Figure 12:
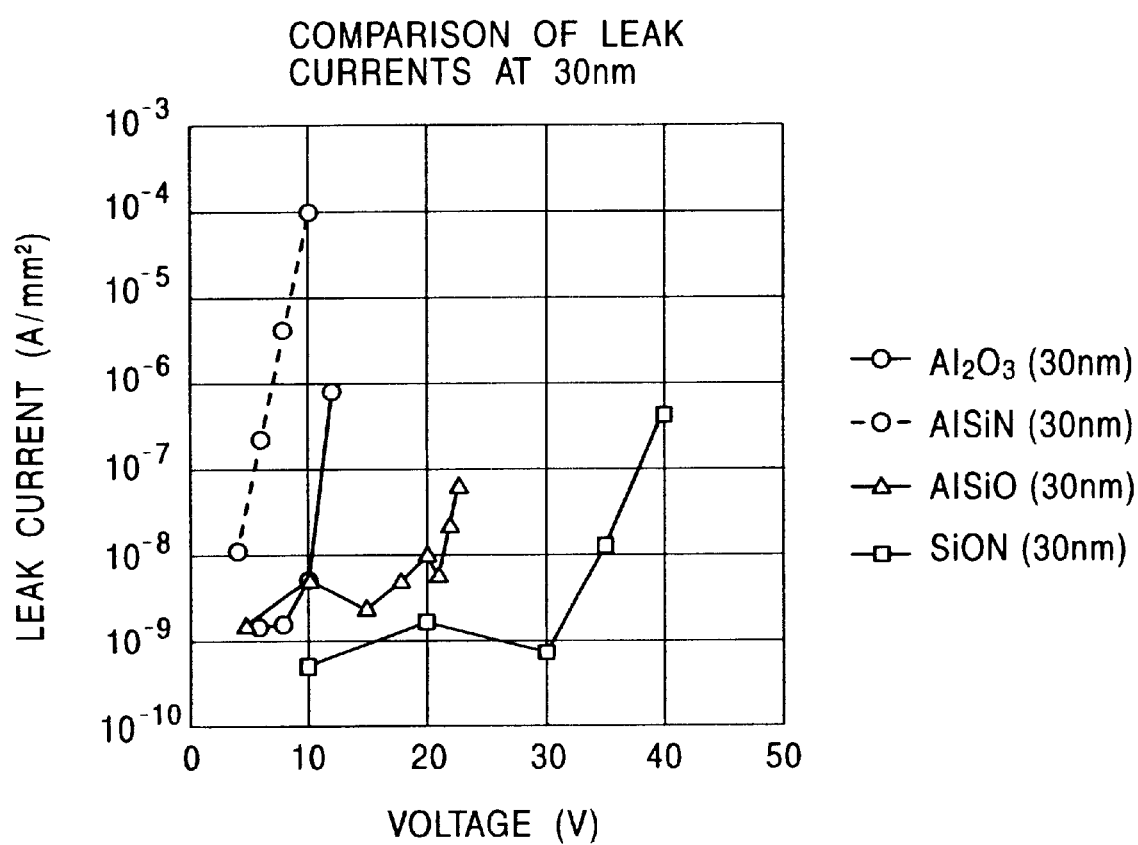
FIG. 12 is a graph showing relationships between voltage and leak current for an Al—Si—O film, an Si—O—N film, an $Al_2O_3$ film, and an Al—Si—N film.

Then, electrode films made of Ni were attached to the upper and lower sides of each thin film formed on a low-resistance Si substrate. While gradually increasing a voltage applied to the thin film, a leak current (A/mm$^2$) was measured and an insulation resistance ($\Omega$) was calculated from the measured value. The thus-obtained experimental results are plotted in FIG. 12.

In the Al—Si—N film as the other Comparative Example, as the voltage was gradually increased, the leak current roses abruptly and breakdown occurred at the time when the voltage reached about 10 V.

In the $Al_2O_3$ film as another Comparative Example, the leak current begun to increase abruptly upon the voltage exceeding about 10 V, and breakdown occurred when the voltage exceeded about 12 V.

On the other hand, in the Al—Si—O film as one Example, the leak current was held low even after the voltage exceeded 20 V. Then, breakdown occurred at the time when the voltage reached about 23 V.

In the Si—O—N film as the other Example, the leak current was held low until the voltage increased to 30 V. Then, breakdown occurred at the time when the voltage reached about 40 V.

Figure 13:
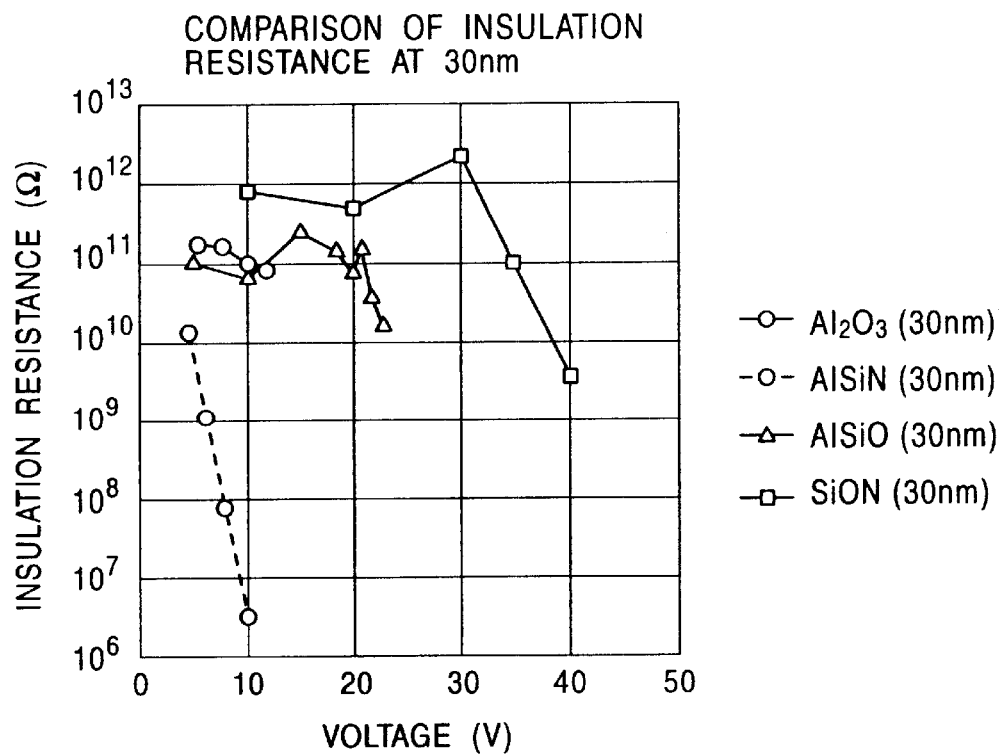
FIG. 13 is a graph showing relationships between voltage and insulation resistance for an Al—Si—O film, an Si—O—N film, an $Al_2O_3$ film, and an Al—Si—N film.

FIG. 13 is a graph showing relationships between voltage and insulation resistance ($\Omega$) for the Al—Si—O film, the Si—O—N film, the $Al_2O_3$ film, and the Al—Si—N film. The graph of FIG. 13 was prepared by calculating values of the insulation resistance ($\Omega$) from the leak current values based on the experimental results plotted in FIG. 12.

As seen from FIG. 13, the $Al_2O_3$ film maintained high insulation resistance until the voltage increased to about 12 V. However, breakdown occurred when the voltage exceeded about 12 V. It was confirmed that the dielectric withstand voltage at the occurrence of breakdown was 4.0 MV/cm.

On the other hand, the Al—Si—O film as one Example maintained high insulation resistance at a satisfactory level even after the voltage exceeded 20 V. Then, breakdown occurred at the time when the voltage reached about 23 V. It was confirmed that the dielectric withstand voltage at the occurrence of breakdown was 7.7 Mv/cm.

Also, the Si—O—N film as the other Example maintained high insulation resistance at a satisfactory level until the voltage increased to 30 V. Then, breakdown occurred at the time when the voltage reached about 40 V. It was confirmed that the dielectric withstand voltage at the occurrence of breakdown was 13.0 MV/cm.

From the above experimental results, it is understood that using the Al—Si—O film or the Si—O—N film as the insulation barrier layer can provide a higher dielectric withstand voltage than that in the case of using alumina, which has been commonly used in the past.

Next, experiments were made on developer resistance. In the experiments, an $Al_2O_3$ film was formed as Comparative Example, and an Al—Si—O film was formed as Example while the amount of Si added in the film was changed. Each of the formed thin films had a thickness of 100 nm. A strong alkaline solution containing KOH, etc., as main ingredients, was used as a developer, and each thin film was exposed to the developer for about 10 minutes. Obtained experimental results are plotted in FIG. 14.

Figure 14:
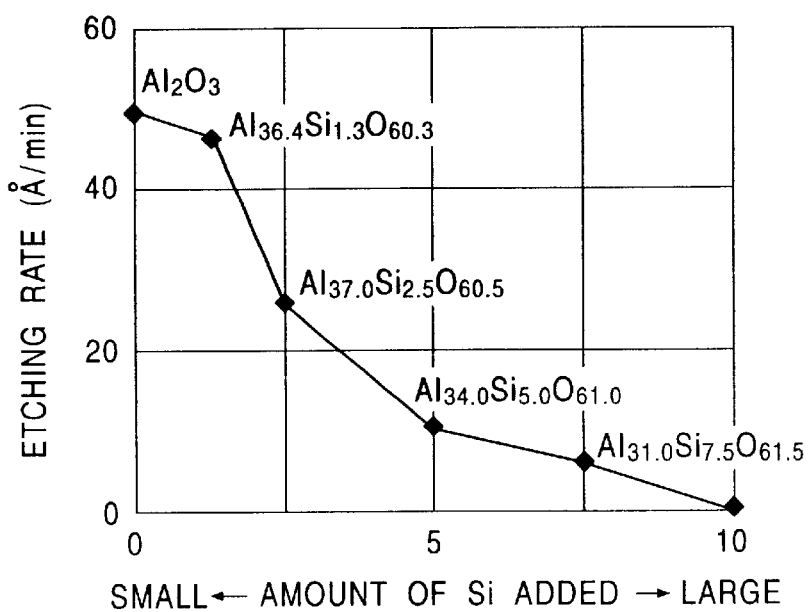
FIG. 14 is a graph showing a relationship between an amount of Si in an Al—Si—O film and an etching rate.

As seen from FIG. 14, the etching rate for the $Al_2O_3$ film was about 50 Å/min.

On the other hand, for the Al—Si—O film added with Si, the etching rate was gradually reduced as the amount of Si added increased. When the amount of Si added reached 10 at %, the etching rate was substantially 0 (Å/min).

It is thus understood that the Al—Si—O film has higher developer resistance than the $Al_2O_3$ film.

Each of FIGS. 15 to 18 shows a transmitted electron-beam diffraction image of the Al—Si—O film. The composition ratio of the Al—Si—O film was $Al_{37.0}Si_{2.5}O_{60.5}$ in FIG. 15, $Al_{34.0}S_{5.0}O_{61.0}$ in FIG. 16, $Al_{31.0}Si_{7.5}O_{61.5}$ in FIG. 17, and $Al_{28.0}Si_{10.0}O_{62.0}$ in FIG. 18 (each numeral represents a value in at %).

Figure 15:
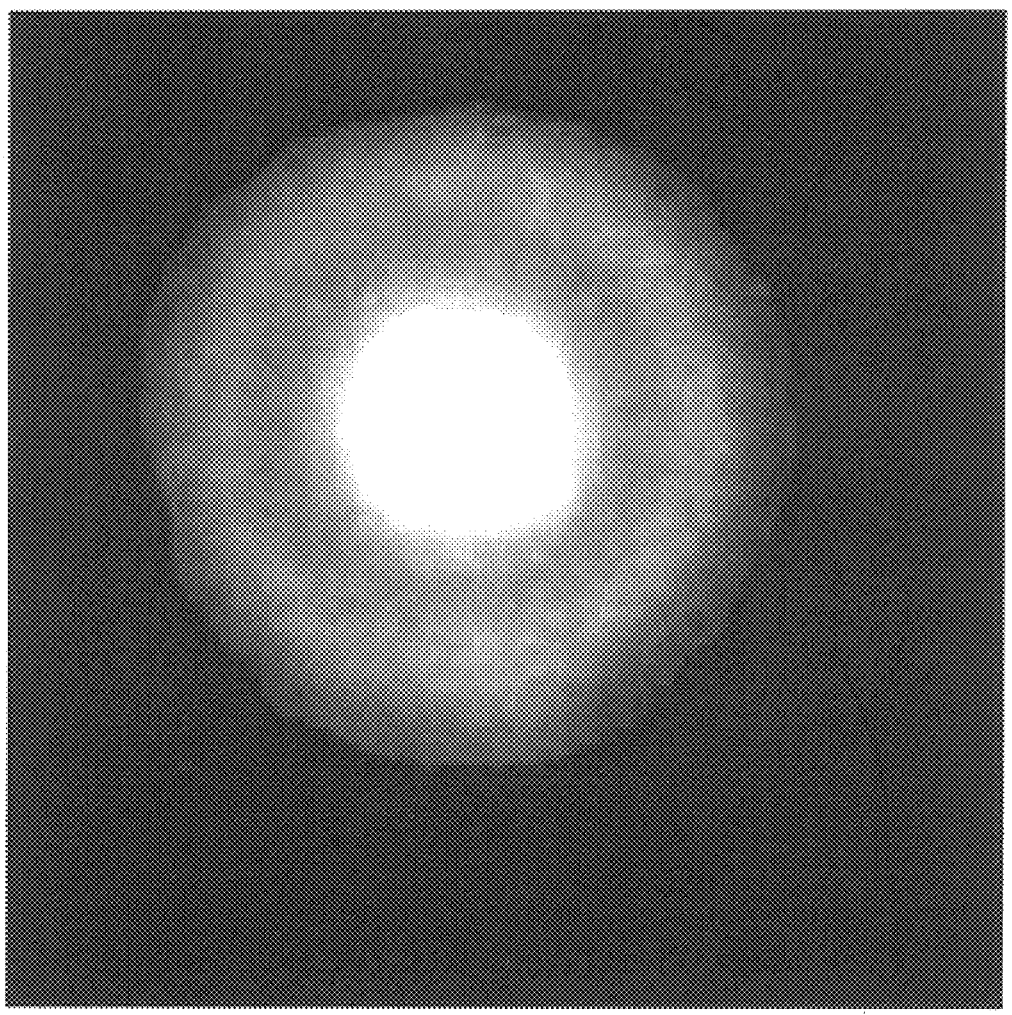
FIG. 15 shows a transmitted electron-beam diffraction image of $Al_{37.0}Si_{2.5}O_{60.5}$.
Figure 16:
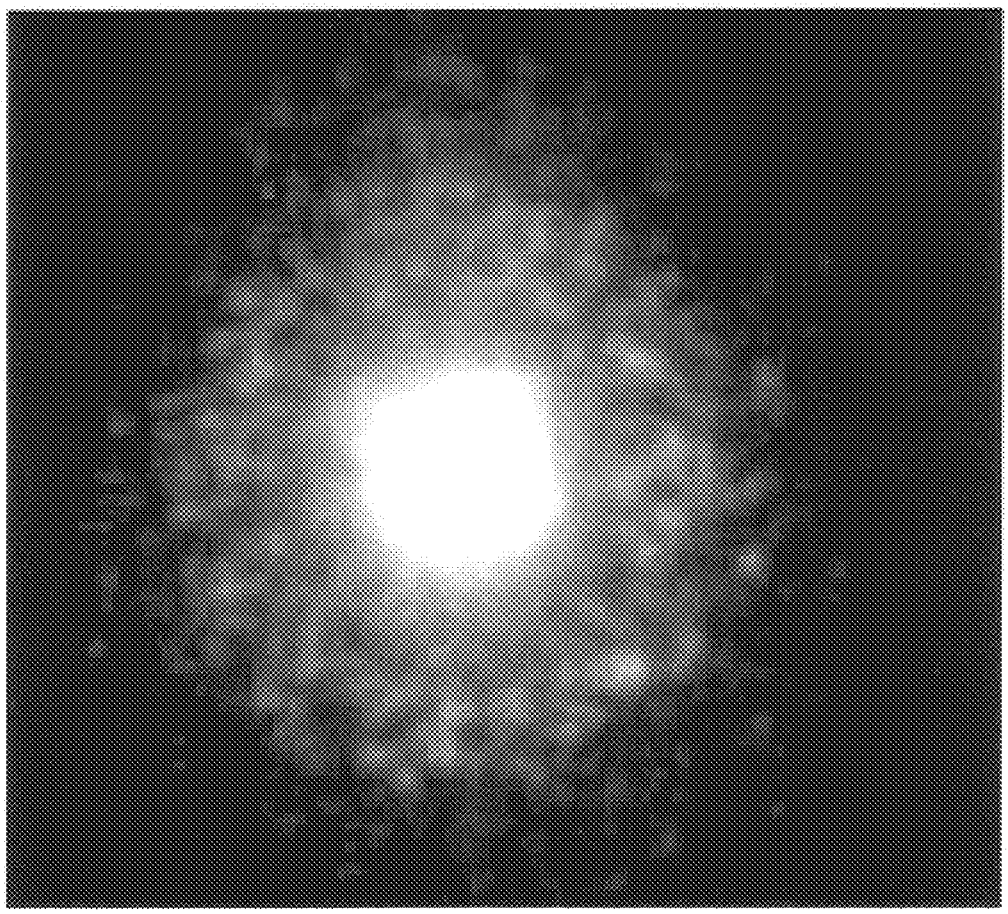
FIG. 16 shows a transmitted electron-beam diffraction image of $Al_{34.0}Si_{5.0}O_{61.0}$.
Figure 17:
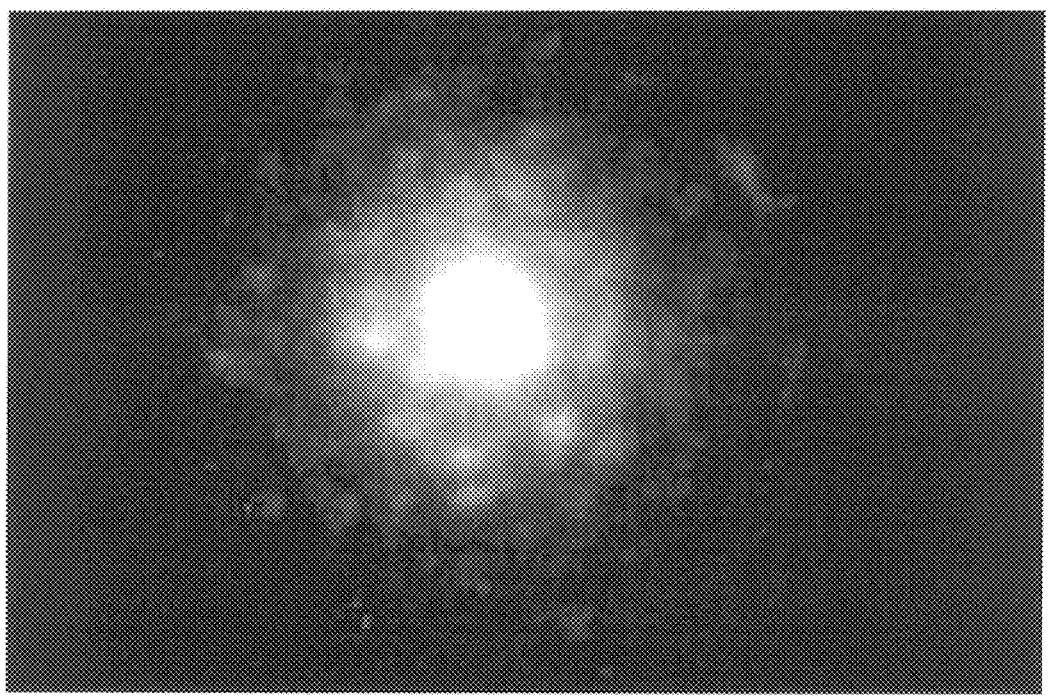
FIG. 17 shows a transmitted electron-beam diffraction image of $Al_{31.0}Si_{7.5}O_{61.5}$.

In FIG. 15, only a blurred image appears around an original beam point photographed at the center of the diffraction image. On the other hand, as shown in FIGS. 16 and 17, as the Si amount increases, an infinite number of minute diffraction spots begin to appear in the blurred image around the original beam point. From those diffraction images, it is estimated that, with an increase in the Si amount, an atomic array of the Al—Si—O film starts to develop regularity at a short range and crystallinity is improved.

Figure 18:
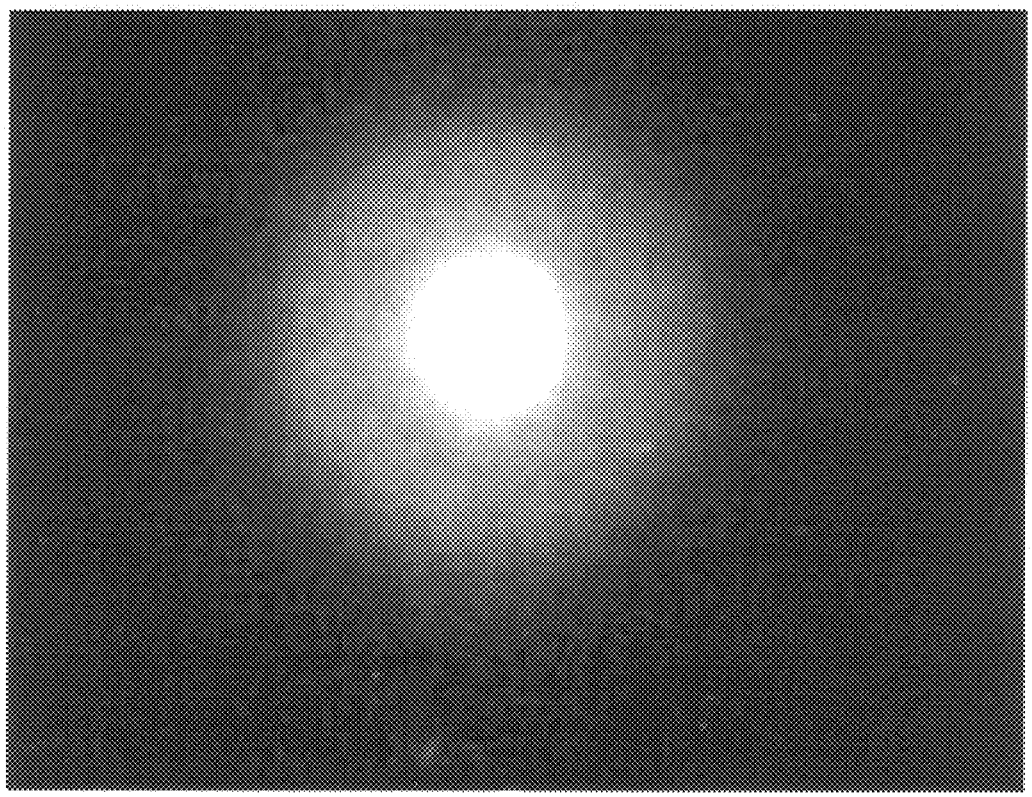
FIG. 18 shows a transmitted electron-beam diffraction image of $Al_{28.0}Si_{10.0}O_{62.0}$.
Figure 19:
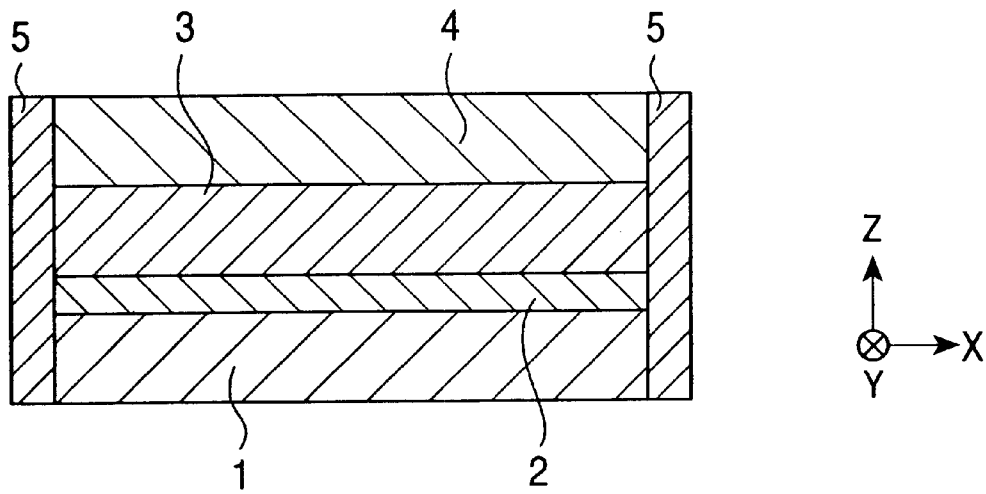
FIG. 19 is a sectional view of one conventional magnetic sensor, looking from the side facing a recording medium.
Figure 20:
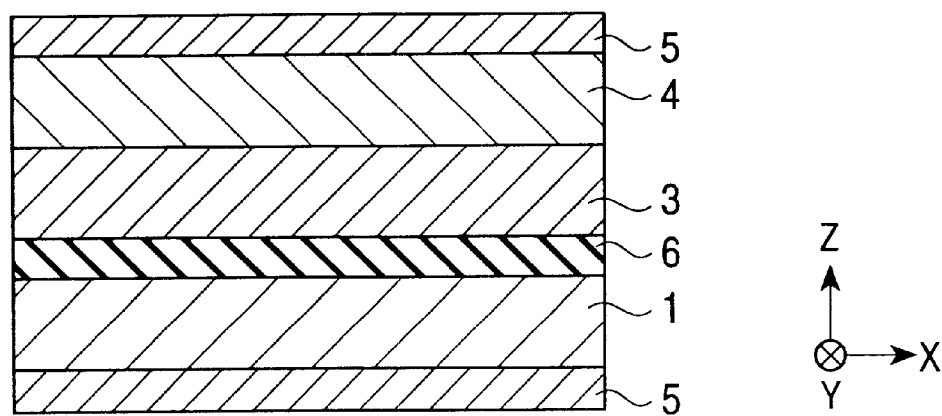
FIG. 20 is a sectional view of another conventional magnetic sensor, looking from the side facing a recording medium.

As shown in FIG. 18, however, when the Si amount reaches 10.0 at %, only the blurred image appears again around the original beam point, and regularity at a short range is lost from the atomic array.

From the transmitted electron-beam diffraction images shown in FIGS. 15 to 18, it is estimated that when the Si amount is 2.5 at % and 10 at %, the film structure is in an almost completely amorphous state, and when the Si amount is 5.0 at % and 7.5 at %, regularity at a short range occurs in the atomic array in addition to the amorphous state and crystallinity is improved.

In the present invention, based on the experimental results shown in FIGS. 12 to 18, the Si amount is set to the range of not less than 2 at % but not more than 9 at % when the insulation barrier layer is formed of an Al—Si—O film. In addition to the above composition ratio, it is preferable that regularity at a short range occurs in the atomic array when observing a transmitted electron-beam diffraction image of the insulation barrier layer.

As described above, since the Al—Si—O film or the Si—O—N film is superior in dielectric strength and developer resistance, a stable resistance change rate can be obtained in a magnetic sensor utilizing the tunneling magnetoresistive effect, in which an insulation barrier layer is formed as the Al—Si—O film or the Si—O—N film.

According to the present invention, as seen from the above description, since the insulation barrier layer is formed of an insulating material expressed by the composition formula of Al—Si—O or Si—O—N, the insulation barrier layer is able to have improved dielectric strength, developer resistance, smoothness, and heat radiation. As a result, a magnetic sensor utilizing the tunneling magnetoresistive effect can be provided in which, in spite of the thickness of the insulation barrier layer being reduced to lower a DC resistance value, it is possible to obtain a stable resistance change rate and to form the insulation barrier layer with good reproducibility.

What is claimed is:

1. A magnetic sensor comprising a multilayered film and electrode layers formed on upper and lower sides of said multilayered film, said multilayered film including an antiferromagnetic layer, a pinned magnetic layer of which magnetized direction is pinned by an exchange coupling magnetic field developed between said pinned magnetic layer and said antiferromagnetic layer, and a free magnetic layer formed on said pinned magnetic layer with an insulation barrier layer interposed therebetween, wherein said insulation barrier layer contains an insulating material having a composition formula of one of Al—Si—O and Si—O—N.

2. A magnetic sensor according to claim 1, wherein the insulating material contains Al—Si—O having Si in a range of not less than 2 at % but not more than 9 at %.

3. A magnetic sensor according to claim 2, wherein when Si in the insulating material, which contains Al—Si—O, is calculated in terms of $SiO_2$ based on stoichiometry in relation to O, a calculated amount of $SiO_2$ is in a range of not less than 10 at % but not more than 38 at % in the insulating material.

4. A magnetic sensor according to claim 2, wherein when Si in the insulating material, which contains Al—Si—O, is calculated in terms of $SiO_2$ based on stoichiometry in relation to O, a calculated amount of $SiO_2$ is in a range of not less than 6.1 mass % but not more than 26.0 mass % in the insulating material.

5. A magnetic sensor according to claim 1, wherein said insulation barrier layer has a thickness in a range of not less than 0.3 nm but not more than 2.0 nm.

6. A magnetic sensor according to claim 5, wherein said insulation barrier layer has a thickness in a range of not less than 0.3 nm but not more than 1.0 nm.

7. A magnetic sensor according to claim 1, wherein regularity at a short range occurs in atomic array of said insulation barrier layer, which contains Al—Si—O, when observing a transmitted electron-beam diffraction image of said insulation barrier layer.

* * * * *